(12) United States Patent
Kim et al.

(10) Patent No.: US 12,356,096 B2
(45) Date of Patent: Jul. 8, 2025

(54) IMAGE SENSOR WITH SIZE-VARIABLE AUTOFOCUS LENSES

(71) Applicant: SAMSUNG ELECTRONICS CO., LTD., Suwon-si (KR)

(72) Inventors: Taehan Kim, Hwaseong-si (KR); Yunki Lee, Hwaseong-si (KR); Dongmin Keum, Daegu (KR); Bumsuk Kim, Hwaseong-si (KR); Kwanghee Lee, Hwaseong-si (KR); Yeaju Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 17/812,487

(22) Filed: Jul. 14, 2022

(65) Prior Publication Data

US 2023/0122283 A1 Apr. 20, 2023

(30) Foreign Application Priority Data

Oct. 20, 2021 (KR) .......................... 10-2021-0140510

(51) Int. Cl.
| | | |
|---|---|---|
| *H10F 39/00* | (2025.01) | |
| *H04N 25/704* | (2023.01) | |
| *H04N 25/77* | (2023.01) | |

(52) U.S. Cl.
CPC .......... *H04N 25/704* (2023.01); *H04N 25/77* (2023.01); *H10F 39/8023* (2025.01); *H10F 39/8053* (2025.01); *H10F 39/8063* (2025.01)

(58) Field of Classification Search
None
See application file for complete search history.

(56) References Cited

U.S. PATENT DOCUMENTS

| | | |
|---|---|---|
| 8,772,892 B2 | 7/2014 | Okigawa |
| 9,780,132 B2 | 10/2017 | Lee et al. |
| 10,088,608 B2 | 10/2018 | Ootsuka et al. |
| 10,256,269 B2 | 4/2019 | Murase et al. |
| 10,277,847 B2 | 4/2019 | Nakara et al. |
| 10,506,187 B2 | 12/2019 | Kim et al. |
| 2006/0145057 A1 | 7/2006 | Kim |

(Continued)

FOREIGN PATENT DOCUMENTS

| | | | |
|---|---|---|---|
| JP | 2004228645 A | * | 8/2004 |
| KR | 1020110079336 | | 7/2011 |

(Continued)

OTHER PUBLICATIONS

Translation of JP2004228645A (Year: 2004).*

*Primary Examiner* — Twyler L Haskins
*Assistant Examiner* — Esley J Chiu
(74) *Attorney, Agent, or Firm* — MORGAN, LEWIS & BOCKIUS LLP

(57) ABSTRACT

An image sensor includes a pixel array in which a plurality of normal pixels and a plurality of autofocus (AF) pixels are disposed, and a logic circuit. The logic circuit provides an autofocus function using a phase difference between pixel signals obtained from each of the plurality of AF pixels. Each of the AF pixels includes a single AF lens disposed on a pair of pixel areas. An AF lens of the AF pixel spaced apart from a center of the pixel array may have an area larger than an area of the AF lens of the AF pixel adjacent to the center.

18 Claims, 32 Drawing Sheets

(56) References Cited

U.S. PATENT DOCUMENTS

| | | | |
|---|---|---|---|
| 2015/0156431 A1* | 6/2015 | Nagata | H01L 27/14605 |
| | | | 348/340 |
| 2016/0071893 A1* | 3/2016 | Shinohara | H10F 39/182 |
| | | | 257/432 |
| 2016/0181309 A1 | 6/2016 | Uehira | |
| 2016/0219235 A1* | 7/2016 | Kakehi | H01L 27/14627 |
| 2016/0358963 A1* | 12/2016 | Kikuchi | H01L 27/14621 |
| 2017/0041525 A1* | 2/2017 | Liu | H04N 23/672 |
| 2017/0366770 A1* | 12/2017 | Yokogawa | H04N 25/704 |
| 2018/0352199 A1* | 12/2018 | Hwang | H04N 9/01 |
| 2019/0052823 A1* | 2/2019 | Jung | H04N 25/76 |
| 2019/0132506 A1* | 5/2019 | Cheng | H04N 25/702 |
| 2021/0120198 A1 | 4/2021 | Kim et al. | |
| 2021/0368117 A1* | 11/2021 | Nishi | H10F 39/8023 |
| 2022/0254820 A1* | 8/2022 | Igarashi | H01L 27/14605 |
| 2022/0271069 A1* | 8/2022 | Fukui | H01L 25/07 |
| 2023/0143333 A1* | 5/2023 | Park | G06T 3/4015 |

FOREIGN PATENT DOCUMENTS

| | | |
|---|---|---|
| KR | 1020110079338 | 7/2011 |
| KR | 1020110114319 | 10/2011 |

\* cited by examiner

IMAGE SENSOR WITH SIZE-VARIABLE AUTOFOCUS LENSES

CROSS TO REFERENCE TO RELATED APPLICATIONS

This application claims priority under 35 U.S.C. § 119 to Korean Patent Application No. 10-2021-0140510, filed on Oct. 20, 2021 in the Korean Intellectual Property Office, the disclosure of which is incorporated by reference herein in its entirety.

TECHNICAL FIELD

Example embodiments of the present disclosure relate to an image sensor.

DISCUSSION OF RELATED ART

An image sensor is a semiconductor-based sensor that receives light and generates an electrical signal. An image sensor may include a pixel array having a plurality of pixels, and a logic circuit that drives the pixel array and generates an image. A plurality of autofocus (AF) pixels may be included in the pixel array to allow a user to focus on a subject to be captured.

SUMMARY

An example embodiment of the present disclosure provides an image sensor which may, by configuring autofocus (AF) lenses included in at least a portion of AF pixels disposed in different positions in a pixel array to have different sizes, reduce a difference in focus positions in the AF pixels, which may improve an autofocus function.

According to an example embodiment of the present disclosure, an image sensor includes a pixel array including a plurality of pixel regions arranged in a first direction and a second direction intersecting the first direction. Each of the plurality of pixel regions includes at least one photodiode, a circuit region disposed below the photodiode, a filter region disposed above the photodiode, and a lens region disposed above the filter region. The image sensor further includes a logic circuit configured to obtain a pixel signal from the circuit region. The pixel array includes a plurality of normal pixels and a plurality of AF pixels. Each of the plurality of AF pixels is disposed in a pair of pixel regions adjacent to each other in the first direction, and includes an AF lens disposed in the lens region above the pair of pixel regions and having a long axis extending in the first direction. A long axis of a first AF lens disposed in a first position of the pixel array is shorter than a long axis of a second AF lens disposed in a second position of the pixel array, and the first position is more adjacent to a center of the pixel array than the second position.

According to an example embodiment of the present disclosure, an image sensor includes a pixel array including a plurality of normal pixels arranged in a first direction and a second direction parallel to an upper surface of a substrate, and a plurality of AF pixels disposed between at least a portion of the plurality of normal pixels. The image sensor further includes a logic circuit configured to provide an autofocus function using a phase difference between pixel signals obtained from each of the plurality of AF pixels. A light receiving region of each of the plurality of AF pixels is larger than a light receiving region of each of the plurality of normal pixels, and each of the plurality of AF pixels includes a pair of photodiodes and an AF lens disposed above the pair of photodiodes. A length of a long axis extending in the first direction in the AF lens included in each of the plurality of AF pixels increases linearly toward a second edge extending in the second direction among a plurality of edges of the pixel array.

According to an example embodiment of the present disclosure, an image sensor includes a pixel array including a plurality of normal pixels and a plurality of AF pixels, and a logic circuit. Each of the plurality of AF pixels has a light receiving region larger than a light receiving region of each of the plurality of normal pixels. The logic circuit is configured to obtain a pixel signal from the pixel array. The plurality of normal pixels include a first normal pixel isolated from an edge of the pixel array by a first distance and adjacent to at least one of the plurality of AF pixels, and a second normal pixel isolated from the edge by a second distance greater than the first distance and not adjacent to the plurality of AF pixels. An area of a first microlens included in the first normal pixel is smaller than an area of a second microlens included in the second normal pixel.

BRIEF DESCRIPTION OF THE DRAWINGS

The above and other features of the present disclosure will become more apparent by describing in detail example embodiments thereof with reference to the accompanying drawings, in which.

DETAILED DESCRIPTION

Figure 1:
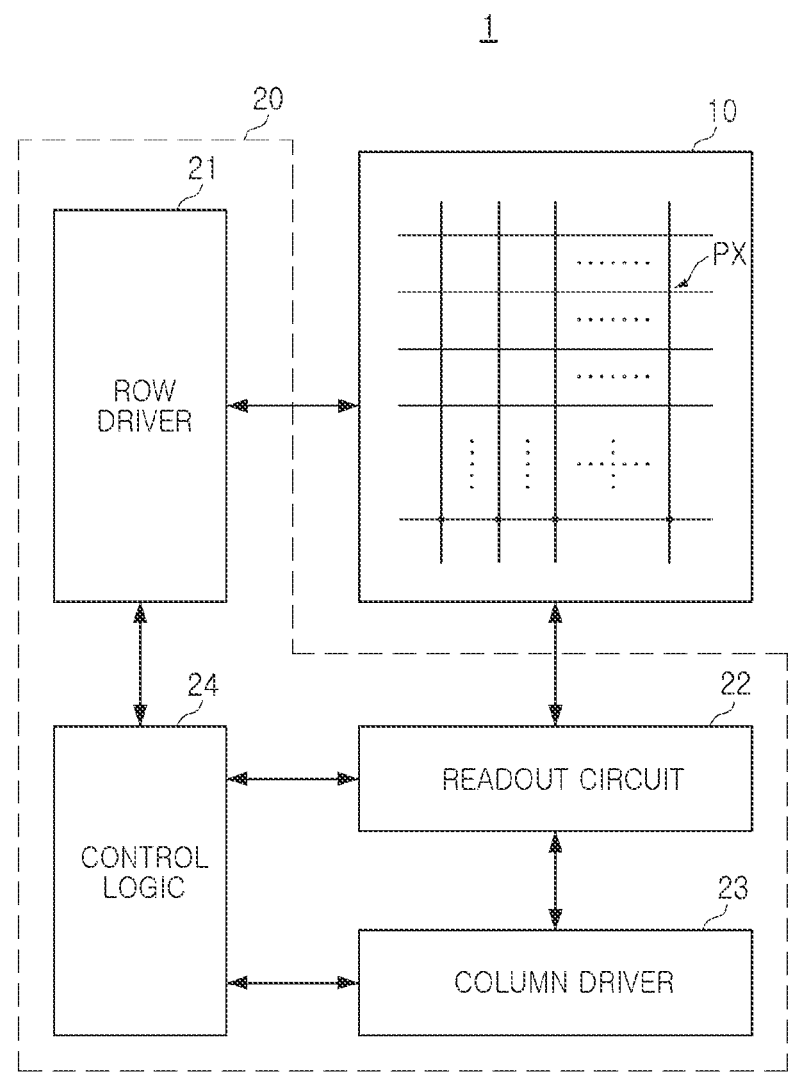
FIG. 1 is a block diagram illustrating an image sensor according to an example embodiment of the present disclosure.

Example embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an image sensor according to an example embodiment.

Referring to FIG. 1, an image sensor 1 may include a pixel array 10 and a logic circuit 20.

The pixel array 10 may include a plurality of pixels PX arranged in array form along a plurality of rows and a plurality of columns. Each of the plurality of pixels PX may include at least one photoelectric conversion device generating electric charges in response to light, and a pixel circuit generating a pixel signal corresponding to electric charges generated by the photoelectric conversion device. The photoelectric conversion device may include a photodiode formed of a semiconductor material, and/or an organic photodiode formed of an organic material.

For example, the pixel circuit may include a floating diffusion region, a transfer transistor, a reset transistor, a driving transistor, and a select transistor. The configuration of the pixels PX may be varied in example embodiments. For example, each of the pixels PX may include an organic photodiode including an organic material, or may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, and a control logic 24. The row driver 21 may drive the pixel array 10 by units of row lines. For example, the row driver 21 may generate a transfer control signal for controlling a transfer transistor of the pixel circuit, a reset control signal for controlling the reset transistor, and a select control signal for controlling the select transistor, and input the signals to the pixel array 10 by units of row lines.

The readout circuit 22 may include a correlated double sampler (CDS) and an analog-to-digital converter (ADC). The correlated double sampler may be connected to the pixels PX via column lines. The correlated double sampler may read, via column lines, a pixel signal from the pixels PX connected to a row line selected by a row line select signal of the row driver 21. The analog-to-digital converter may convert the pixel signal detected by the correlated double sampler into a digital pixel signal and may transfer the signal to the column driver 23.

The column driver 23 may include a latch or buffer for temporarily storing a digital pixel signal, and an amplifier circuit, and may process a digital pixel signal received from the readout circuit 22. The row driver 21, the readout circuit 22 and the column driver 23 may be controlled by the control logic 24. The control logic 24 may include a timing controller for controlling operation timings of the row driver 21, the readout circuit 22, and the column driver 23.

Pixels PX arranged in the same position in the horizontal direction among the pixels PX may share the same column line. For example, the pixels PX disposed in the same position in the vertical direction may be simultaneously selected by the row driver 21 and may output pixel signals via column lines. In an example embodiment, the readout circuit 22 may simultaneously obtain pixel signals from the pixels PX selected by the row driver 21 via column lines. The pixel signal may include a reset voltage and a pixel voltage, and the pixel voltage may be obtained by reflecting electric charges generated in response to light in each of the pixels PX to the reset voltage.

The pixels PX may be disposed in a plurality of pixel regions defined on a substrate providing a pixel array. For example, the pixels PX may include a plurality of autofocus pixels and a plurality of normal pixels. In an example embodiment, each of the plurality of autofocus pixels may have a light receiving region larger than that of each of the normal pixels.

For example, each of the plurality of normal pixels may be disposed in a single pixel region, and each of the plurality of autofocus pixels may be disposed in a pair of adjacent pixel regions. Accordingly, each of the plurality of autofocus pixels may have a relatively larger light receiving region. In each of the plurality of autofocus pixels, an AF lens may be disposed on a pair of pixel regions to collect light, and a microlens may be disposed above a pixel region in each of the plurality of normal pixels. Accordingly, the AF lens may have an area larger than that of the microlens.

An angle of incidence of light traveling to the pixel array 10 may be greater in a region adjacent to an edge of the pixel array 10 than in a region adjacent to a center of the pixel array 10. For example, according to an example embodiment, an angle of incidence of light traveling to the pixel array 10 may be greater in a region more adjacent to an edge of the pixel array 10 than in a region more adjacent to a center of the pixel array 10. Accordingly, in an example embodiment, in the autofocus pixel disposed adjacent to the center of the pixel array 10 (e.g., more adjacent to the center of the pixel array 10), light passing through the AF lens may be focused on the photodiode, whereas in the autofocus pixel disposed adjacent to the edge of the pixel array 10 (e.g., more adjacent to the edge of the pixel array 10), light passing through the AF lens may be focused above the photodiode. In other words, a focusing position in the autofocus pixels may be varied depending on a position in the pixel array 10.

In an example embodiment, to address the above issues, the area of the AF lens may be formed differently, depending on the position in the pixel array 10. Accordingly, in each of the autofocus pixels, light passing through the AF lens may be focused on the photodiode, and the autofocus function of the image sensor 1 may improve.

Figure 2A:
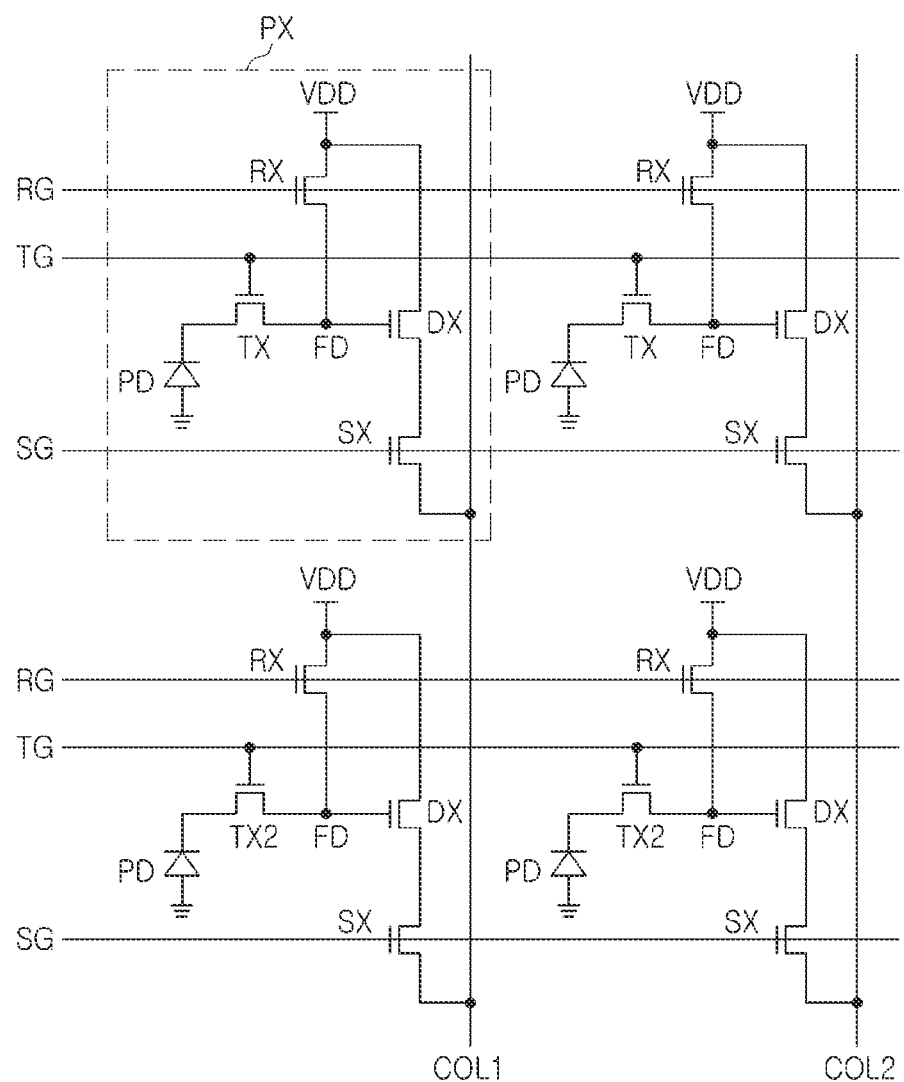
FIGS. 2A and 2B are diagrams illustrating a pixel circuit of an image sensor according to an example embodiment of the present disclosure.
Figure 2B:
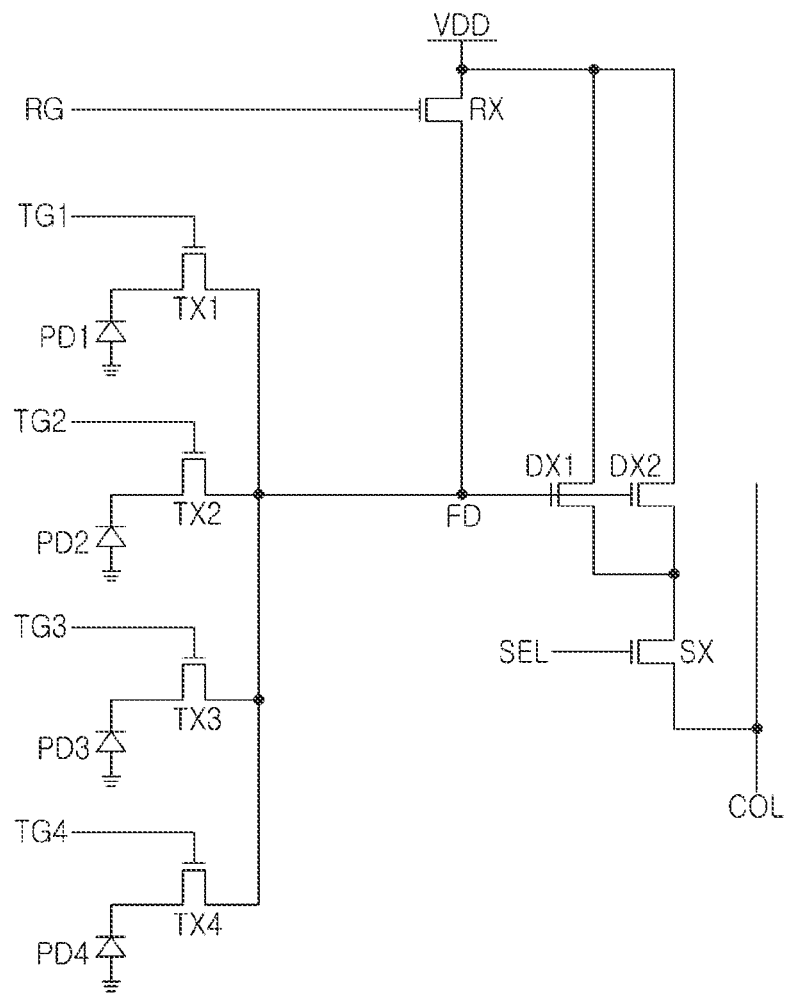

FIGS. 2A and 2B are diagrams illustrating a pixel circuit of an image sensor according to an example embodiment.

Referring first to FIG. 2A, each of the plurality of pixels PX may include a photodiode PD and a pixel circuit. The pixel circuit may include a transfer transistor TX, a reset transistor RX, a select transistor SX, and a driving transistor DX. Also, the pixel circuit may include a floating diffusion region FD in which electric charges generated by the photodiode PD are accumulated.

The photodiode PD may generate and accumulate electric charges in response to incident light. The photodiode PD may be replaced with, for example, a phototransistor, a photogate, or a pinned photodiode, in example embodiments. The transfer transistor TX may move electric charges generated by the photodiode PD to the floating diffusion region FD. The floating diffusion region FD may store electric charges generated by the photodiode PD. A voltage output by the driving transistor DX may be varied depending on the amount of electric charges accumulated in the floating diffusion region FD.

The reset transistor RX may reset a voltage of the floating diffusion region FD by removing electric charges accumulated in the floating diffusion region FD. A drain electrode of the reset transistor RX may be connected to the floating diffusion region FD, and a source electrode of the reset transistor RX may be connected to the power voltage VDD. When the reset transistor RX is turned on, the power voltage VDD connected to the source electrode of the reset transistor RX may be applied to the floating diffusion region FD, and the reset transistor RX may remove electric charges accumulated in the floating diffusion region FD.

The driving transistor DX may operate as a source follower buffer amplifier. The driving transistor DX may amplify changes in voltage in the floating diffusion region FD and may output the amplified change to one of the column lines COL1 and COL2. The select transistor SX may select the pixels PX to be read by row units. When the select transistor SX is turned on, the voltage of the driving transistor DX may be output to one of the column lines COL1 and COL2. For example, when the select transistor SX is turned on, a reset voltage or a pixel voltage may be output via the column lines COL1 and COL2.

In an example embodiment illustrated in FIG. 2A, each of the plurality of pixels PX may include a photodiode PD and a transfer transistor TX, and also a reset transistor RX, a select transistor SX, and a driver, whereas, in an example embodiment illustrated in FIG. 2B, two or more pixels adjacent to each other may share at least a portion of the transistors included in the pixel circuit. According to an embodiment, four adjacent pixels may share a floating diffusion region FD, a reset transistor RX, driving transistors DX1 and DX2, and a select transistor SX.

For example, the first photodiode PD1 of the first pixel and the first transfer transistor TX1 may be connected to the floating diffusion region FD. Similarly, the second to fourth photodiodes PD2-PD4 of the second to fourth pixels PX2-PX4 may be connected to the floating diffusion region FD via the second to fourth transfer transistors TX2-TX4. For example, the first to fourth transfer transistors TX1 to TX4 may be connected to the floating diffusion region FD in common by connecting the floating diffusion regions FD included in each of the pixels to each other using a wiring pattern.

The pixel circuit may include a reset transistor RX, first and second driving transistors DX1 and DX2, and a select transistor SX. The reset transistor RX may be controlled by the reset control signal RG, and the select transistor SX may be controlled by the select control signal SEL. For example, each of the four pixels may further include another transistor in addition to the transfer transistor TX. Two of the four transistors included in the four pixels may be connected to each other in parallel and may provide first and second driving transistors DX1 and DX2, and one of the other two transistors may be configured to provide the reset transistor RX.

However, the pixel circuit described with reference to FIG. 2B is merely an example embodiment, and example embodiments of the present disclosure are not limited thereto. For example, according to an example embodiment, one of the four transistors may be allocated as a driving transistor, and one of the four transistors may be allocated as a select transistor. Also, by connecting the other two transistors to each other in series and allocating the transistors as the first and second reset transistors, an image sensor which may adjust a conversion gain of a pixel may be implemented. Alternatively, the pixel circuit may be varied depending on the number of transistors included in each of the pixels.

Figure 3:
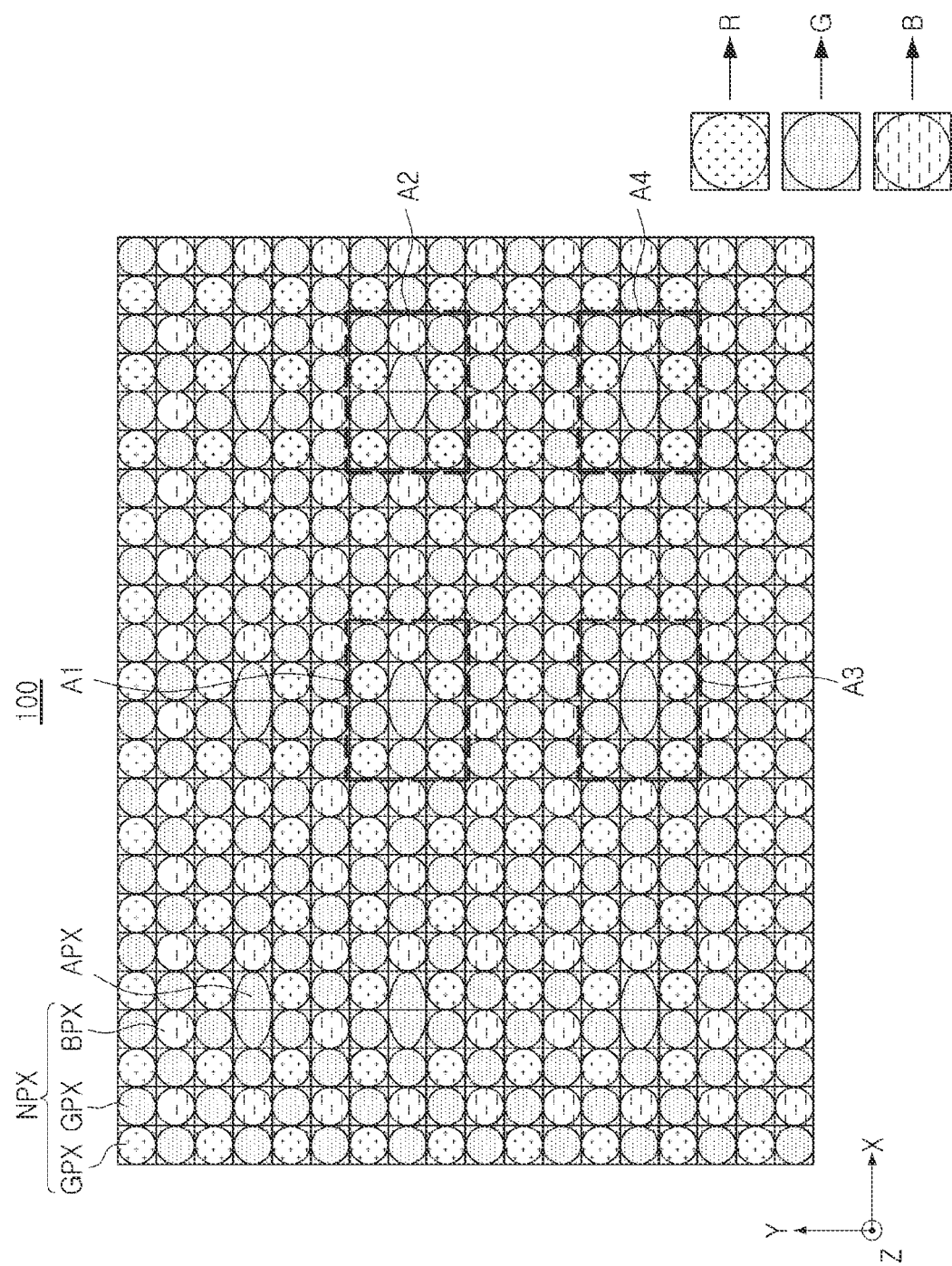
FIG. 3 is a diagram illustrating a pixel array according to an example embodiment of the present disclosure.

FIG. 3 is a diagram illustrating a pixel array according to an example embodiment.

Referring to FIG. 3, the pixel array 100 of the image sensor in an example embodiment may include a plurality of pixel regions arranged in a first direction (X-axis direction) and a second direction (Y-axis direction), and may further include a plurality of pixels NPX and APX disposed in the plurality of pixel regions. The plurality of pixels NPX and APX may include a plurality of normal pixels NPX and a plurality of autofocus (AF) pixels. The plurality of normal pixels NPX may include red pixels RPX, green pixels GPX and blue pixels BPX. Each of the red pixels GPX may include a red color filter, each of the green pixels GPX may include a green color filter, and each of the blue pixels BPX may include a blue color filter. In example embodiments, the plurality of normal pixels NPX may further include at least one yellow pixel and at least one white pixel.

In an example embodiment according to FIG. 3, each of the plurality of AF pixels APX may have a light receiving region larger than that of each of the plurality of normal pixels NPX. For example, each of the plurality of normal pixels NPX may be disposed in a single pixel region, and the plurality of AF pixels APX may be disposed in a pair of pixel regions adjacent to each other in the first direction. In an example embodiment, a photodiode may be disposed in each of the plurality of pixel regions, and accordingly, the light receiving region of each of the plurality of AF pixels APX may be twice the light receiving region of each of the plurality of normal pixels NPX.

Each of the plurality of normal pixels NPX may include a single microlens disposed in a single pixel region. Each of the plurality of AF pixels APX may include a single AF lens disposed in a pair of pixel regions. A long axis of the AF lens extending in the first direction may be larger than a diameter of the microlens.

A logic circuit connected to the pixel array 100 may implement an autofocus function using a phase difference between pixel signals obtained from a pair of photodiodes included in the plurality of AF pixels APX. To accurately focus on a subject by accurately implementing the autofocus function, it is desirable that the focus of light collected by the AF lens in the plurality of AF pixels APX arranged in various positions of the pixel array 100 be accurately disposed on the photodiode. However, in the AF pixels APX spaced apart from the center of the pixel array 100, the focus of light focused by the AF lens may be disposed on the photodiode in a third direction (Z axis) due to the angle of incidence of light incident to the AF lens. Accordingly, performance of the autofocus function may be deteriorated.

In an example embodiment, AF lenses included in at least a portion of the plurality of AF pixels APX may have different sizes depending on positions in the pixel array 100. For example, a first AF lens included in the first AF pixel disposed adjacent to the center of the pixel array 100 and a second AF lens included in the second AF pixel disposed adjacent to the edge of the pixel array 100 may have different sizes. As described above, each of the first AF lens and the second AF lens may have a long axis extending in the first direction, and the long axis of the first AF lens may be shorter than the long axis of the second AF lens. Accordingly, light passing through the second AF lens in the second AF pixel may be collected by the photodiode, and the autofocus function of the image sensor including the pixel array 100 may improve.

Figure 4A:
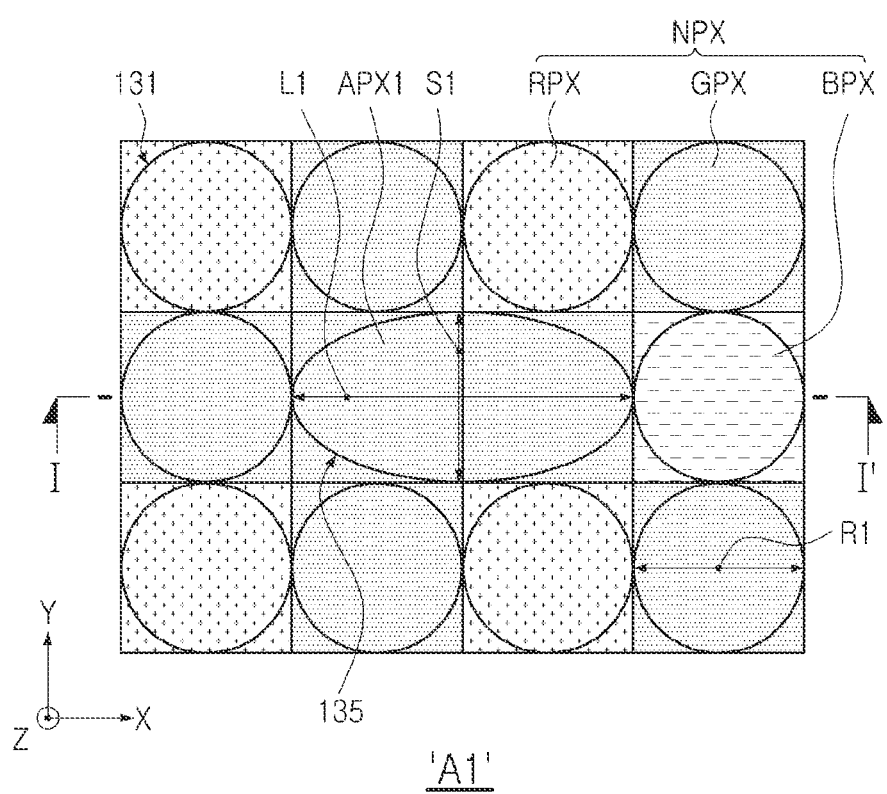
FIGS. 4A and 4B are enlarged diagrams illustrating region A1 and region A2, respectively, illustrated in FIG. 3 according to example embodiments of the present disclosure.
Figure 4B:
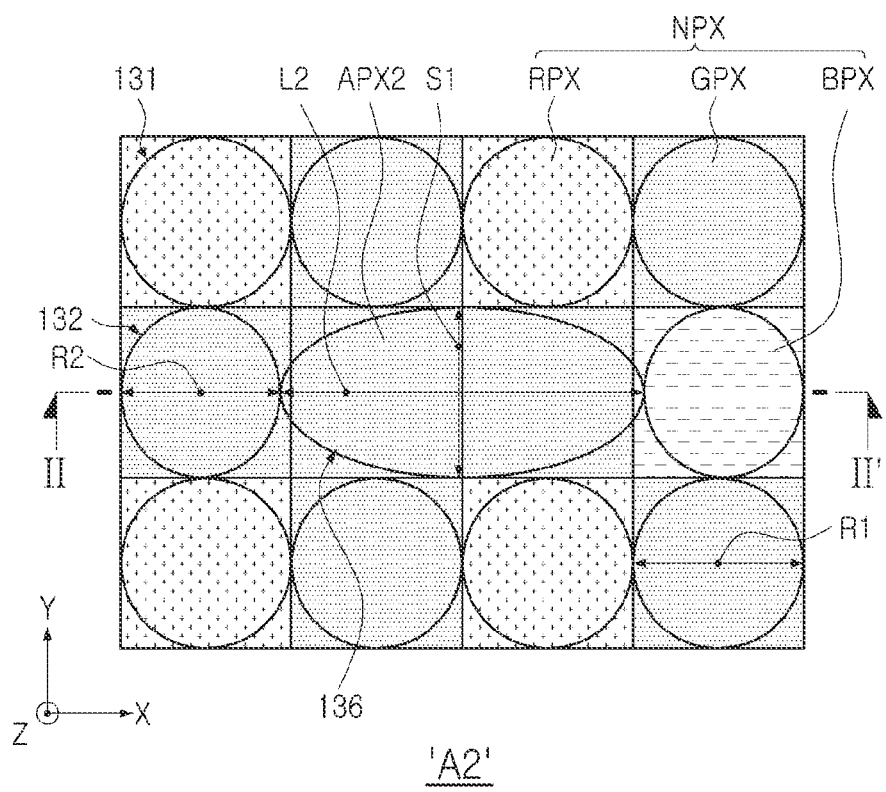

FIGS. 4A and 4B are enlarged diagrams illustrating region A1 and region A2, respectively, illustrated in FIG. 3 according to example embodiments of the present disclosure.

Referring to FIG. 4A, ten normal pixels NPX and a single AF pixel APX1 may be disposed in region A1 of the pixel array 100. As described above, the normal pixels NPX may include a red pixel RPX, a green pixel GPX, and a blue pixel BPX, and the red pixel RPX and the blue pixel BPX may be adjacent to each other in a diagonal direction. Each of the red pixel RPX and the blue pixel BPX may be adjacent to the green pixel GPX in the first direction (X-axis direction) and the second direction (Y-axis direction).

The AF pixel APX1 in the region A1 may be defined as the first AF pixel APX1, and may include a green color filter similar to the green pixel GPX. Differently from each of the normal pixels NPX disposed in a single pixel region, the first AF pixel APX1 may be disposed in a pair of pixel regions adjacent to each other in the first direction. Also, the first AF lens 135 included in the first AF pixel APX1 may have a first long axis L1 in the first direction and a first short axis S1 in the second direction. In an example embodiment illustrated in FIG. 4A, the first short axis S1 of the first AF lens 135 may be substantially equal to a diameter R1 of the microlens 131 included in each of the normal pixels NPX. The first long axis L1 of the first AF lens 135 may be larger than the diameter R1 of the microlens 131. For example, the first long axis L1 of the first AF lens 135 may be about twice the diameter R1 of the microlens 131.

FIG. 4B is an enlarged diagram illustrating region A2 of the pixel array 100 according to an example embodiment. As shown in FIG. 4B, in an example embodiment, ten normal pixels NPX and a single AF pixel APX2 may be disposed in the region A2. The AF pixel APX2 in the region A2 may be defined as the second AF pixel APX2. As described above with reference to FIG. 3, the region A1 and the region A2 may be disposed in different positions in the first direction. For example, the region A1 may be disposed more adjacent to the center of the pixel array 100, and the region A2 may be disposed more adjacent to the edge of the pixel array 100. Accordingly, an angle of incidence of light traveling to the region A1 may be different from an angle of incidence of light traveling to the region A2.

In the region A2 adjacent to the edge of the pixel array 100, the angle of incidence of incident light may be greatly shifted, and accordingly, the position in which light is focused within the second AF pixel APX2 may be different from the position in which light is focused within the first AF pixel APX1. For example, in the first AF pixel APX1, light may be focused on at least one of photodiodes included in the first AF pixel APX1, whereas in the second AF pixel APX2, light may not be focused on the photodiodes included in the second AF pixel APX2. For example, in the second AF pixel APX2, as the angle of incidence of incident light increases, light may be focused on the photodiodes in the third direction (Z-axis direction).

In an example embodiment, to address the above issues, the second AF lens 136 may be configured to have a size larger than that of the first AF lens 135 as illustrated in FIG. 4B. In an example embodiment, the second AF lens 136 may have a second long axis L2 and a first short axis S1, and the second long axis L2 may be longer than the first long axis L1. For example, a difference in lengths between the second long axis L2 and the first long axis L1 may be proportional to a difference in positions between the first AF pixel APX1 and the second AF pixel APX2 in the first direction.

As the second AF lens 136 is configured to have the second long axis L2 increasing in the first direction, the shape of the microlens 132 may change in the neighboring pixels GPX and BPX adjacent to both sides of the second AF pixel APX2 in the first direction as illustrated in FIG. 4B. Referring to FIG. 4B, each of the pair of microlenses 132 adjacent to both sides of the second AF lens 136 in the first direction may have a width R2 smaller than the diameter R1 of the other microlenses 131 in the first direction.

In other words, the area of the microlens 132 included in each of the neighboring pixels GPX and BPX adjacent to both sides of the second AF pixel APX2 may be smaller than the area of the microlens 131 included in the other normal pixels NPX. However, since the size of the microlens 132 is reduced only on one side of the first direction, and not in the plurality of directions, a decrease in sensitivity of the neighboring pixels GPX and BPX adjacent to both sides of the second AF pixel APX2 may not be great enough such that the decrease may not affect operations of the image sensor.

Also, the microlens 132 included in each of the neighboring pixels GPX and BPX may have a diameter R1 in the second direction and a width R2 smaller than the diameter R1 in the first direction. Accordingly, the microlens 132 included in each of the neighboring pixels GPX and BPX may have a shape different from a circular shape, such as, for example, an asymmetric shape.

Figure 5:
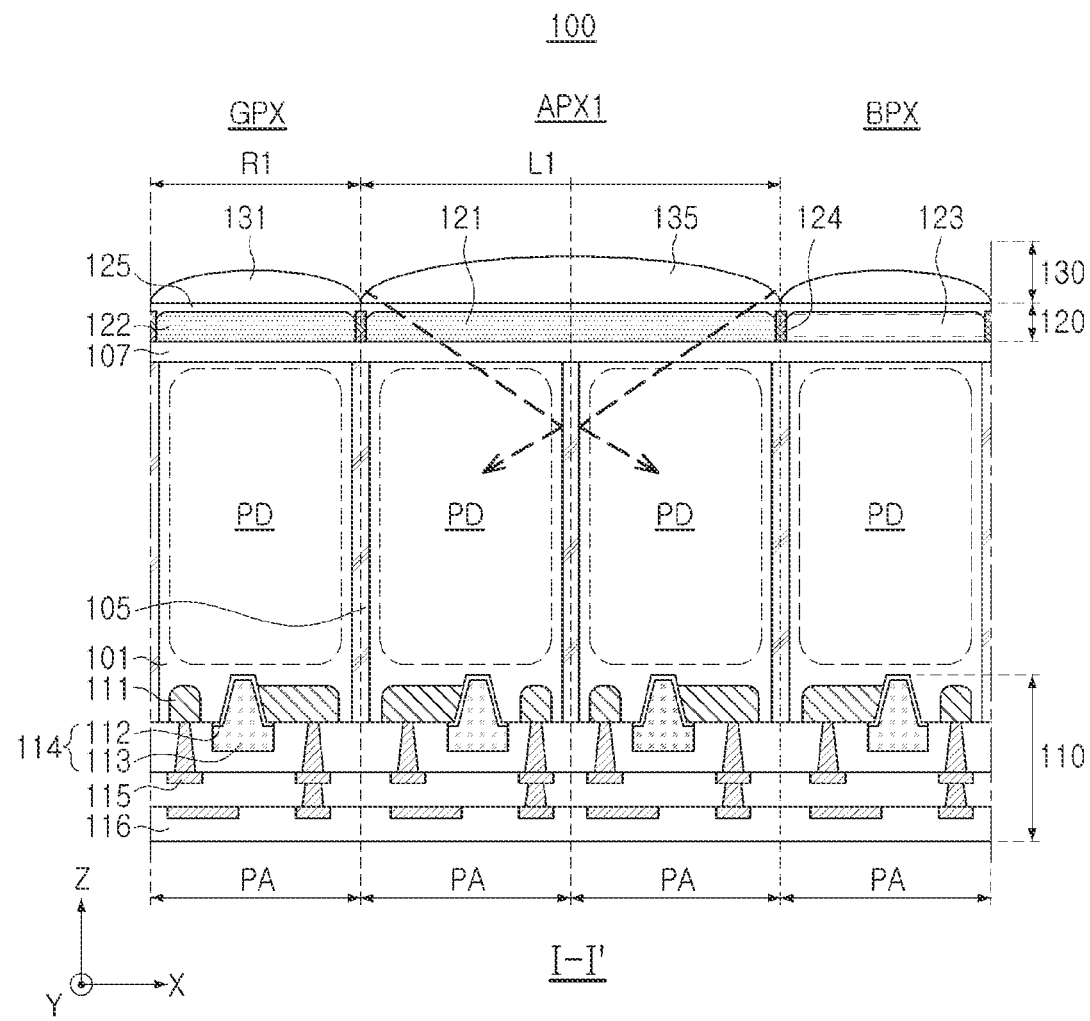
FIG. 5 is a cross-sectional diagram taken along line I-I' in FIG. 4A according to an example embodiment of the present disclosure.

FIG. 5 is a cross-sectional diagram taken along line I-I' in FIG. 4A according to an example embodiment of the present disclosure.

Referring to FIG. 5, a plurality of pixel regions PA may be defined in a first direction (X-axis direction) and a second direction (Y-axis direction) parallel to an upper surface of the substrate 101, and at least one photodiode PD may be formed in each of the plurality of pixel regions PA. The plurality of pixel regions PA may be isolated from each other by the pixel isolation layer 105, and accordingly, the pixel isolation layer 105 may be disposed between the photodiodes PD adjacent to each other in the first direction and the second direction. The pixel isolation layer 105 may be formed of a material reflecting light.

Referring to FIG. 5, each of the plurality of pixel regions PA may include a circuit region 110 disposed below the photodiode PD, a filter region 120 disposed above the photodiode PD, and a lens region 130. The circuit region 110 may include circuit devices having an active region 111 doped with impurities and a gate structure 114, wiring patterns 115 for connecting the circuit devices to each other, and an interlayer insulating layer 116 covering the wiring patterns 115. The gate structure 114 may include a gate insulating layer 112 and a gate electrode layer 113, and at least one of the gate structures 114 may have a region embedded in the substrate 101 as illustrated in FIG. 5.

The filter region 120 disposed on the photodiode PD may include a plurality of color filters 121-123 arranged in the first direction and the second direction, a fence pattern 124 isolating the plurality of color filters 121-123 from each other, and a planarization layer 125. As described above with reference to FIG. 4A, each of the plurality of color filters 121-123 may have one of red, green, and blue colors. The fence pattern 124 may be disposed on the pixel isolation layer 105 and may be formed in a checkerboard pattern, similar to the pixel isolation layer 105. The fence pattern 124 may be formed of a material having a high reflectance, which may prevent crosstalk between the plurality of color filters 121-123.

In an example embodiment, the fence pattern 124 is not formed on the pixel isolation layer 105 between the pair of photodiodes PD included in the first AF pixel APX1. Accordingly, the color filter 121 included in the first AF pixel APX1 may have an area relatively larger than those of the color filters 122 and 123 included in the other normal pixels GPX and BPX. For example, the area of the color filter 121 included in the first AF pixel APX1 may be at least twice the area of each of the color filters 122 and 123 included in the other normal pixels GPX and BPX.

A horizontal insulating layer 107 may be disposed between the filter region 120 and the substrate 101. In an example embodiment, the horizontal insulating layer 107 may include a plurality of insulating layers formed of different materials, and at least one of the plurality of insulating layers may be formed of a high-k material. A high-k material may have a dielectric constant higher than that of silicon oxide (SiOx), and may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), and zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The horizontal insulating layer 107 may be configured to cure defects occurring in the substrate 101 during a process of manufacturing the pixel array 100. For example, during the process of manufacturing the pixel array 100, excess charges may be generated due to a defect occurring in the substrate 101, which may cause an issue such as a decrease in the dark level of the image sensor. The horizontal insulating layer 107 may remove excess charges by curing such defects, which may prevent a decrease in the dark level and reducing white spots appearing in an image.

The lens region 130 may be disposed on the filter region 120. The lens region 130 may include a plurality of lenses, and the first AF lens 135 may be disposed in the region A1 together with the plurality of microlenses 131. As described above, the first AF lens 135 may be disposed throughout a pair of pixel regions PA, and accordingly, a length of the first long axis L1 of the first AF lens 135 in the first direction may be about twice the diameter R1 of each of the microlenses 131. The first AF lens 135 may be included in the first AF pixel APX1. Thus, according to an example embodiment, the first AF lens 135 may be included in a single AF pixel.

Referring to FIG. 5, a plurality of pixel regions PA may be defined in a first direction (X-axis direction) and a second direction (Y-axis direction) parallel to an upper surface of the substrate 101, and at least one photodiode PD may be formed in each of the pixel regions PA. The plurality of pixel regions PA may be isolated from each other by the pixel isolation layer 105, and accordingly, the pixel isolation layer 105 may be disposed between the photodiodes PD adjacent to each other in the first direction and the second direction. The pixel isolation layer 105 may be formed of a material reflecting light.

Referring to FIG. 5, each of the plurality of pixel regions PA may include a circuit region 110 disposed below the photodiode PD, a filter region 120 disposed above the photodiode PD, and a lens region 130. The circuit region 110 may include circuit devices having an active region 111 doped with impurities and a gate structure 114, wiring patterns 115 for connecting the circuit devices to each other, and an interlayer insulating layer 116 covering the wiring patterns 115. The gate structure 114 may include a gate insulating layer 112 and a gate electrode layer 113, and at least one of the gate structures 114 may have a region embedded in the substrate 101 as illustrated in FIG. 5.

The filter region 120 disposed above the photodiode PD may include a plurality of color filters 121-123 arranged in the first direction and the second direction, a fence pattern 124 isolating the plurality of color filters 121-123 from each other, and a planarization layer 125. As described above with reference to FIG. 4A, each of the plurality of color filters 121-123 may have one of red, green, and blue colors. The fence pattern 124 may be disposed on the pixel isolation layer 105 and may be formed in a checkerboard shape similar to the pixel isolation layer 105. The fence pattern 124 may be formed of a material having a high reflectance, which may prevent crosstalk between the plurality of color filters 121-123.

A horizontal insulating layer 107 may be formed between the filter region 120 and the substrate 101. In an example embodiment, the horizontal insulating layer 107 may include a plurality of insulating layers formed of different materials, and at least one of the plurality of insulating layers may be formed of a high-k material. A high-k material may have a dielectric constant higher than that of silicon oxide (SiOx), and may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), and zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The horizontal insulating layer 107 may be configured to cure defects occurring in the substrate 101 during a process of manufacturing the pixel array 100. For example, during the process of manufacturing the pixel array 100, excess charges may be generated due to a defect occurring in the substrate 101, which may cause an issue such as a decrease in the dark level of the image sensor. The horizontal insulating layer 107 may remove excess charges by curing such defects, which may prevent a decrease in the dark level and reducing white spots appearing in an image.

The lens region 130 may be disposed on the filter region 120. The lens region 130 may include a plurality of lenses. The first AF lens 135 may be disposed in the region A1 together with the plurality of microlenses 131. The first AF lens 135 may be included in the first AF pixel APX1. Thus, according to an example embodiment, the first AF lens 135 may be included in a single AF pixel.

As described above, the first AF lens 135 may be disposed throughout a pair of pixel regions PA, and accordingly, the first long axis L1 of the first AF lens 135 in the first direction may be twice the diameter R1 of each of the microlenses 131. Also, the first AF lens 135 may have a thickness greater than those of the other microlenses 132 in the third direction (Z-axis direction). Accordingly, the upper surface of the first AF lens 135 may be disposed at a level higher than a level of the upper surface of the other microlenses 132.

Referring to FIG. 5, in an example embodiment, in region A1 disposed adjacent to the center of the pixel array 100, an angle of incidence of light incident to the first AF lens 135 is not relatively large. Accordingly, as illustrated in FIG. 5, light refracted by the first AF lens 135 may be directly incident to the pair of photodiodes PD included in the first AF pixel APX1 or may be reflected from the pixel isolation layer 105 between the pair of photodiodes PD and may be incident to the pair of photodiodes PD again.

Differently from the above configuration, in regions disposed relatively far from the center of the pixel array 100, an angle of incidence of light incident to the AF lens may be shifted with respect to the upper surface of the substrate 101. Accordingly, the focus of light refracted by the AF lens may be disposed on the region above the pair of photodiodes PD, such as, for example, the horizontal insulating layer 107 or the filter region 120, rather than the pair of photodiodes PD. In this case, differently from the center of the pixel array 100, the effect of the autofocus function may not be sufficiently obtained with pixel signals obtained from an AF pixel adjacent to the edge of the pixel array 100.

In an example embodiment, as described above with reference to FIG. 4B, the AF lens of the AF pixel adjacent to the edge of the pixel array 100 may be configured to have a relatively larger size, thereby addressing the above issue. Also, in the AF pixel adjacent to the edge of the pixel array 100, by disposing the AF lens and the color filter therebelow to be offset from each other, the effect of the autofocus function of the image sensor may improve. Hereinafter, this configuration will be described in greater detail with reference to FIGS. 6 and 7.

Figure 6:
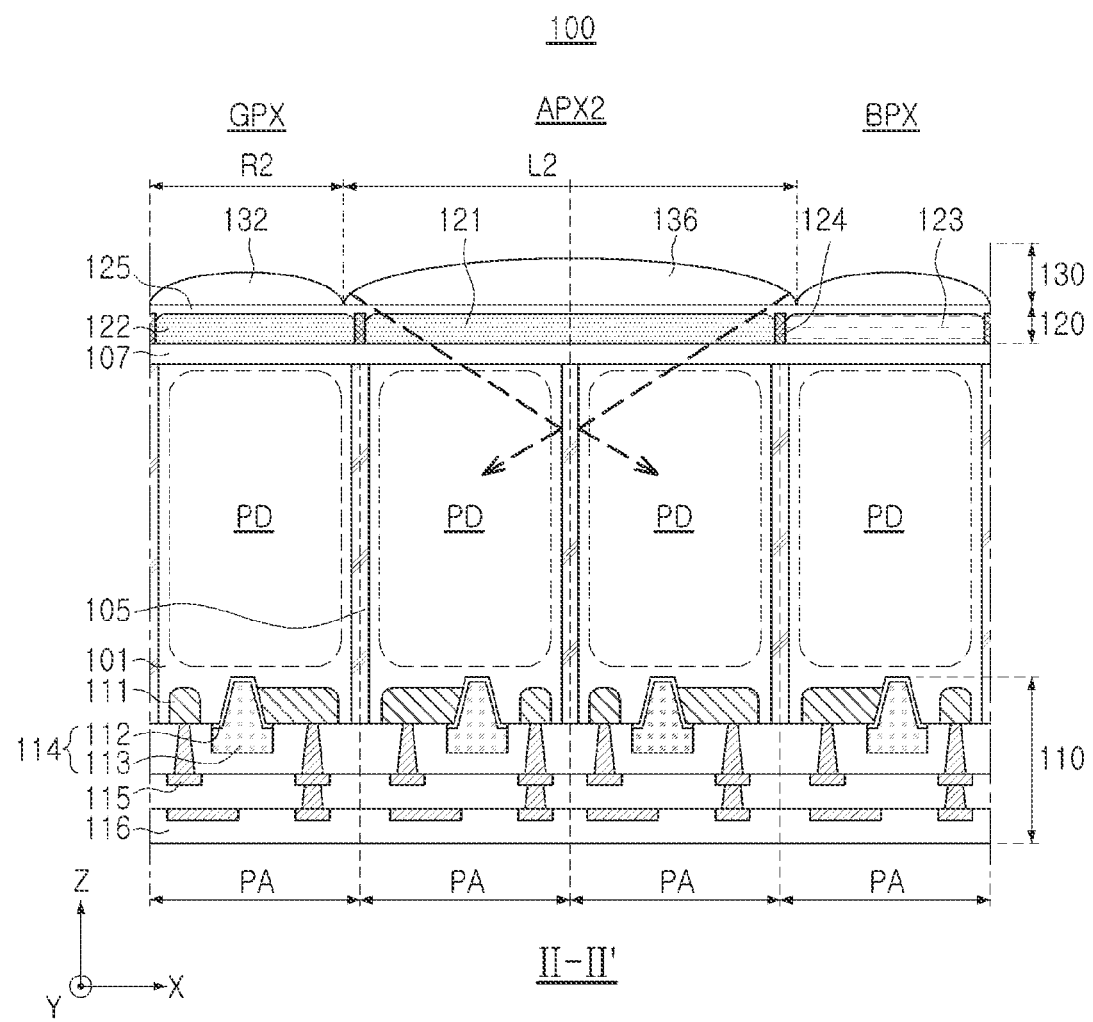
FIG. 6 and FIG. 7 are cross-sectional diagrams taken along line II-II' in FIG. 4B according to example embodiments of the present disclosure.
Figure 7:
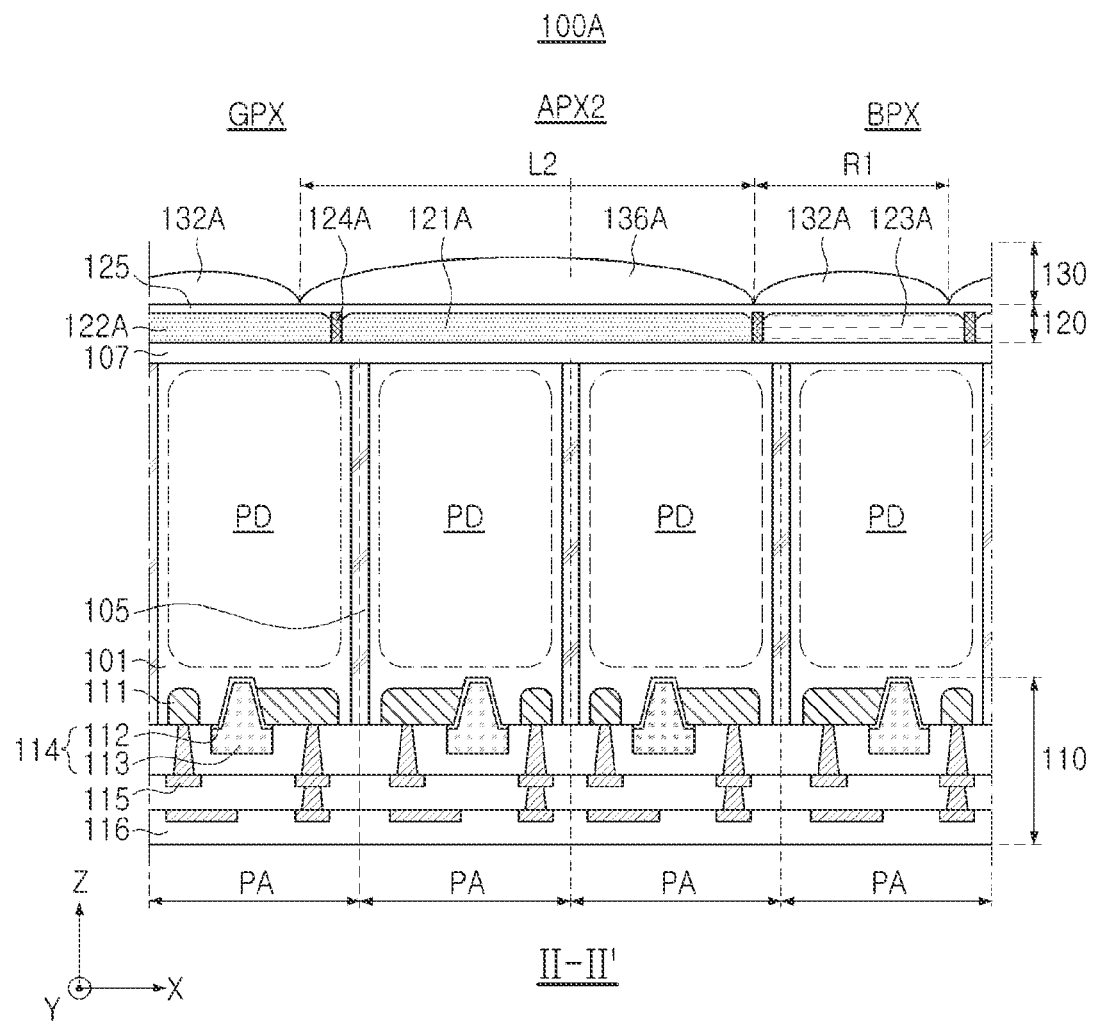

FIGS. 6 and 7 are cross-sectional diagrams taken along line II-II' in FIG. 4B according to example embodiments of the present disclosure.

For example, FIGS. 6 and 7 are cross-sectional diagrams illustrating a cross-sectional surface of region A2 of the pixel array 100. Referring to FIGS. 6 and 7, the pixel regions PA in which the photodiodes PD are disposed, the circuit region 110 disposed below the photodiodes PD, and the horizontal insulating layer 107 disposed above the photodiodes PD may be the same as in the aforementioned example embodiment described with reference to FIG. 5. Thus, for convenience of explanation, a further description of technical aspects and components previously described may be omitted.

Referring to FIG. 6, the second AF lens 136 included in the lens region 130 may extend as much as the second long axis L2 in the first direction, and a length of the second long axis L2 may be longer than the length of the first long axis L1. As the second AF lens 136 extends as much as the second long axis L2 in the first direction, the pair of microlenses 132 adjacent to the second AF lens 136 may have a width R2 smaller than the diameter R1 of the microlens lens 131.

As described with reference to FIGS. 5 and 6, the second AF lens 136 disposed in the region A2 adjacent to the edge of the pixel array 100 may be configured to have a size greater than that of the first AF lens 135 disposed in the region A1 adjacent to the center of the pixel array 100. For example, in each of the AF pixels APX1 and APX2, the second long axis L2 of the second AF lens 136 may be longer than the first long axis L1 of the first AF lens 135 in the first direction in which the pair of photodiodes are adjacent to each other. Accordingly, as illustrated in FIG. 6, in an example embodiment, the focus of light refracted through the second AF lens 136 is not disposed on the horizontal insulating layer 107 or the filter region 120, and rather, may be disposed on the photodiode PD, or may be reflected from the pixel isolation layer 105 and may be incident to the photodiode PD.

Referring to FIGS. 5 and 6, each of the first AF lens 135 and the second AF lens 136 may have a thickness greater than that of the microlenses 131 and 132 of each of the normal pixels NPX. Also, the first AF lens 135 and the second AF lens 136 may have the same thickness. However, example embodiments of the present disclosure are not limited thereto. For example, according to example embodiments, to vary the refractive index, the first AF lens 135 and the second AF lens 136 may have different thicknesses. For example, the second AF lens 136 may have a thickness smaller than that of the first AF lens 135.

Also, in an example embodiment, to increase the effect of the autofocus function in the second AF pixel APX2, the second AF pixel APX2 may be configured such that second AF lens 136 and the color filter 121 may be offset in the first direction. In the pixel array 100A according to an example embodiment illustrated in FIG. 7, the center of the second AF lens 136A may be offset from the center of the color filter 121A.

Referring to FIG. 7, the second AF lens 136A may be disposed more adjacent to the center of the pixel array 100A than the color filter 121A. Accordingly, in an example embodiment, a boundary between the second AF lens 136A and the other microlenses 132A is also not aligned with the fence pattern 124A included in the filter region 120. In an example embodiment, a boundary between the second AF lens 136A and other microlenses 132A may be disposed more adjacent to the center of the pixel array 100A than the fence pattern 124A in the first direction. Accordingly, in an example embodiment, even in the normal pixels GPX and BPX, the microlenses 132A and the color filters 122A and 123A are not aligned with each other, and rather, may be offset.

As illustrated in FIG. 7, by offsetting the lens region 130 and the filter region 120, the focus of light refracted through the lens region 130 may be disposed on the photodiode PD of each of the pixel regions PA. The degree to which the lens region 130 and the filter region 120 are offset may be varied depending on the position of the pixel array 100A. In an example embodiment, the lens region 130 and the filter region 120 may be offset more greatly toward the edge of the pixel array 100A.

The lens region 130 and the filter region 120 may be offset from each other and may also be offset with respect to the pixel regions PA defined on the substrate 101. In other words, as illustrated in FIG. 7, the filter region 120 may be offset to be disposed more adjacent to the center of the pixel array 100A with respect to the pixel regions PA, such that the fence pattern 124A is not aligned with the pixel isolation layer 105. Also, the lens region 130 may be offset more greatly than the filter region 120 with respect to the pixel regions PA.

Figure 8:
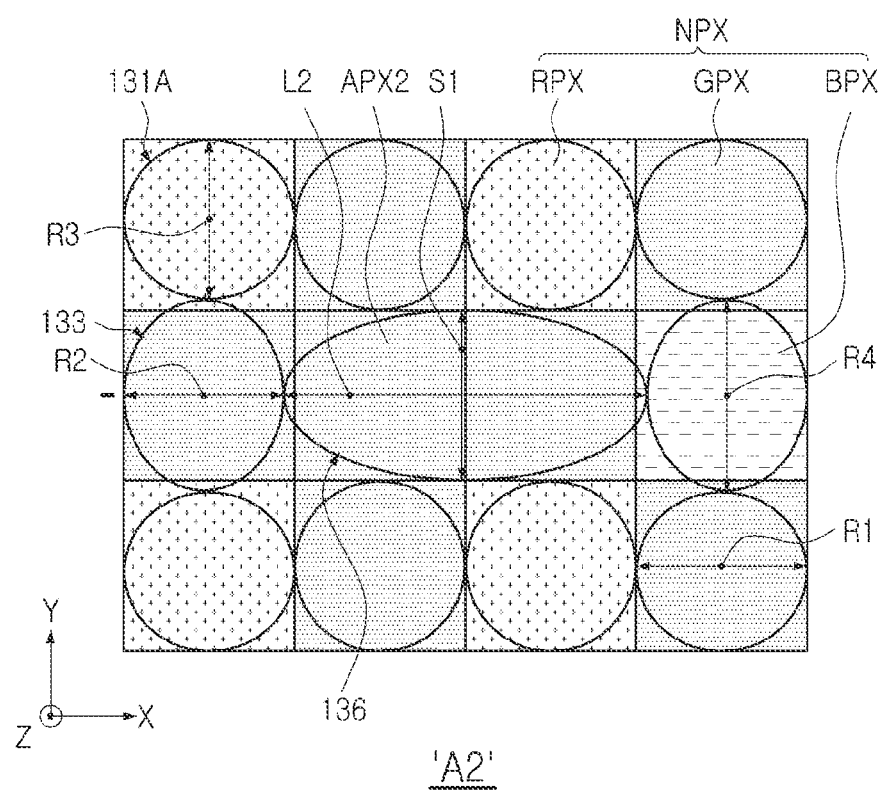
FIG. 8 is an enlarged diagram illustrating region A2 illustrated in FIG. 3 according to an example embodiment of the present disclosure.

FIG. 8 is an enlarged diagram illustrating region A2 illustrated in FIG. 3 according to an example embodiment of the present disclosure.

Referring to FIG. 8, ten normal pixels NPX and a single second AF pixel APX2 may be disposed in region A2 of the pixel array 100. As described above, in the region A2 adjacent to the edge of the pixel array 100, an angle of incidence of incident light may be greatly shifted, and accordingly, the second AF lens 136 may be configured to have a relatively large size such that the position in which light is focused in the second AF pixel APX2 may be aligned with the photodiodes.

For example, the second AF lens 136 may be configured to have a size larger than those of the other AF lenses disposed adjacent to the center of the pixel array 100, and may have a second long axis L2 longer than the other AF lenses in the first direction. Since the second AF lens 136 has the second long axis L2 increased in the first direction, the microlens 133 of each of the neighboring pixels adjacent to both sides of the second AF pixel APX2 in the first direction may have a width R2 smaller than a diameter R1 of the other microlenses in the first direction as illustrated in FIG. 8. Accordingly, intensity of the pixel signal may decrease in the neighboring pixels adjacent to both sides of the second AF pixel APX2, and accordingly, sensitivity may be deteriorated.

In an example embodiment illustrated in FIG. 8, to reduce the decrease in sensitivity described above, the size of the microlens 133 included in each of the neighboring pixels may be increased in the second direction. Accordingly, as illustrated in FIG. 8, the microlens of each of the other normal pixels adjacent to the neighboring pixels in the second direction may have a height R3 smaller than the diameter R1 of the other microlenses in the second direction. The microlens 133 included in each of the neighboring pixels may have a height R4 greater than the diameter R1 of the other microlenses in the second direction.

In other words, in an example embodiment illustrated in FIG. 8, the decrease in sensitivity due to an increase in the size of the second AF lens 136 may also be applied to the other pixels adjacent to the neighboring pixels, rather than being applied only to the neighboring pixels adjacent to the second AF pixel APX2. In an example embodiment illustrated in FIG. 4B, two normal pixels may bear the same intensity of degradation, whereas in an example embodiment illustrated in FIG. 8, six normal pixels may bear the same degradation, and accordingly, a noticeable decrease in sensitivity throughout an image may be avoided.

Figure 9:
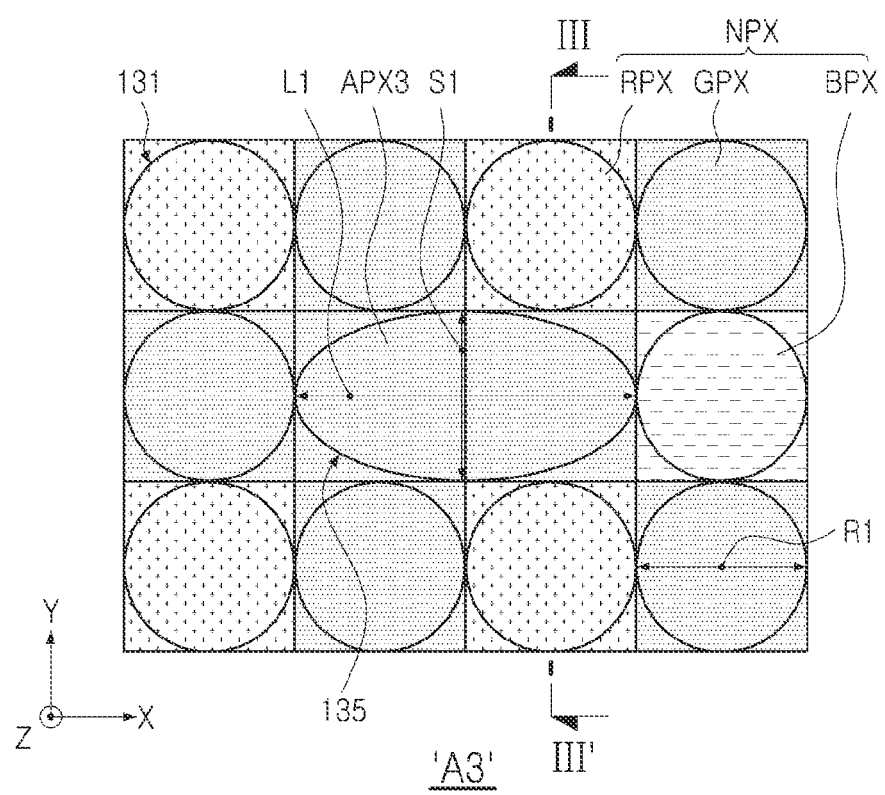
FIG. 9 is an enlarged diagram illustrating region A3 illustrated in FIG. 3 according to an example embodiment of the present disclosure.

FIG. 9 is an enlarged diagram illustrating region A3 illustrated in FIG. 3 according to an example embodiment of the present disclosure.

As described above with reference to FIG. 3, region A3 may be disposed more adjacent to the edge of the pixel array 100 than the region A1. However, differently from the region A2 described above, the region A3 may be disposed in the same position as that of the region A1 in the first direction and may be disposed in a position different from that of the region A1 in the second direction. Also, since a pair of photodiodes in each of the plurality of AF pixels APX are adjacent to each other in the first direction, the third AF pixel APX3 disposed in the region A3 may include the third AF lens 137 the same as the first AF lens 135 in the region A1 described above with reference to FIG. 4A.

Figure 10:
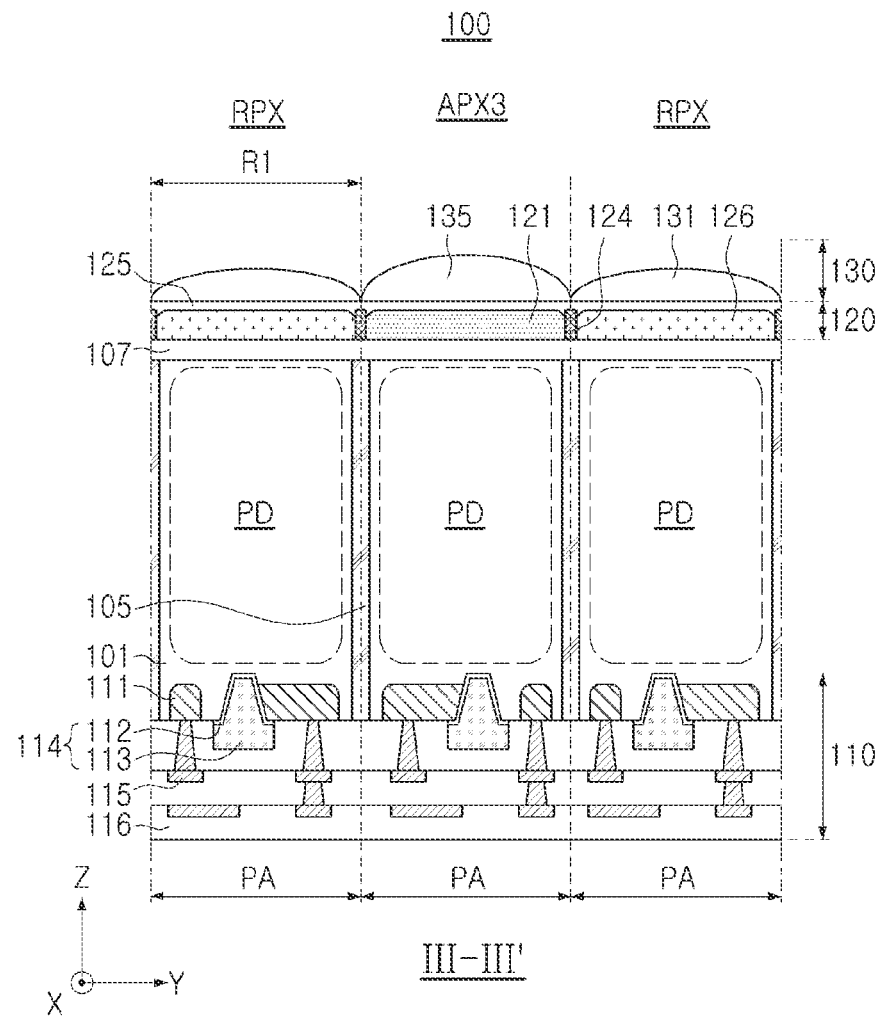
FIGS. 10 and 11 are cross-sectional diagrams taken along line III-III' in FIG. 9 according to example embodiments of the present disclosure.
Figure 11:
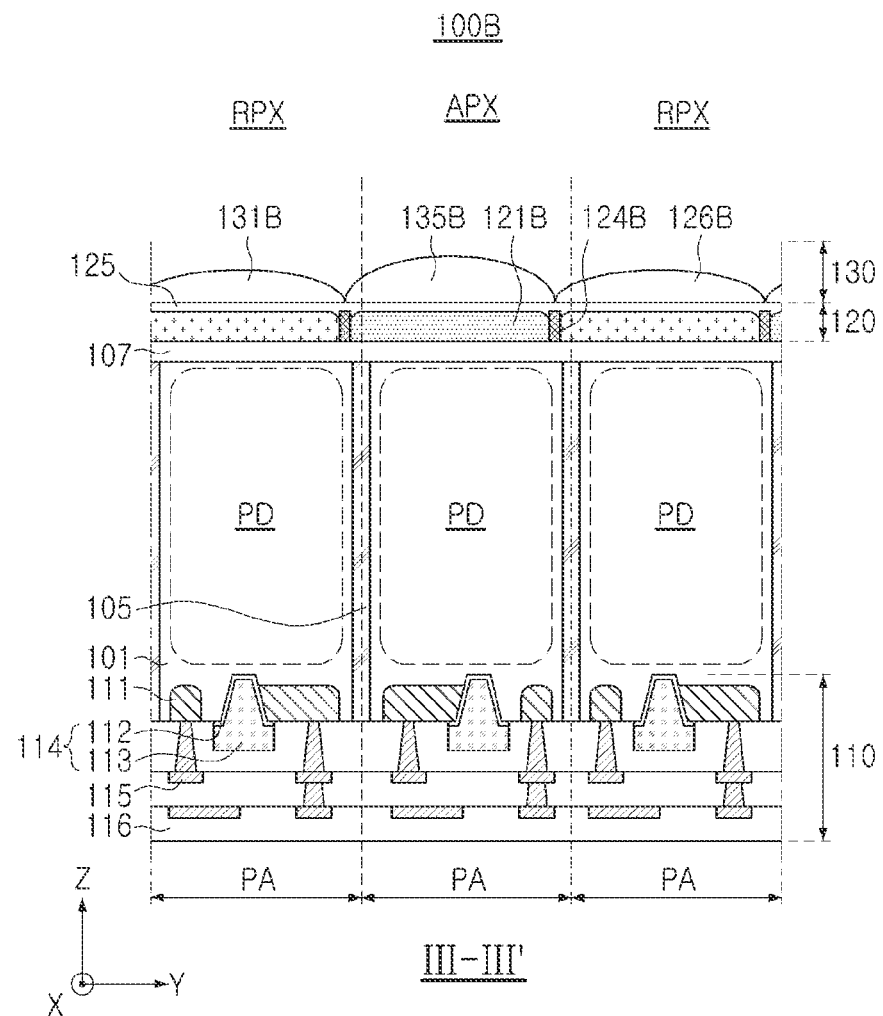

FIGS. 10 and 11 are cross-sectional diagrams taken along line III-III' in FIG. 9 according to example embodiments of the present disclosure.

For example, FIGS. 10 and 11 are cross-sectional diagrams illustrating a cross-sectional surface of region A3 of the pixel array 100 in the second direction. Referring to FIGS. 10 and 11, the pixel regions PA in which the photodiodes PD are disposed, the circuit region 110 disposed below the photodiodes PD, the horizontal insulating layer 107 and the filter region 120 disposed above the photodiodes PD, and the lens region 130 may be the same as described above with reference to FIG. 5. For example, the filter region 120 may include a color filter 121 corresponding to the third AF pixel APX3 and a red color filter 126 corresponding to the red pixels RPX. For convenience of explanation, a further description of components and technical aspects previously described may be omitted.

As described above, the third AF lens 137 of the third AF pixel APX3 may be the same as the first AF lens 135 of the first AF pixel APX1. The third AF lens 137 may have a first long axis L1 in the first direction and a first short axis S1 in the second direction, and the first short axis S1 may be the same as the diameter R1 of the other microlens 131. As illustrated in FIG. 10, in the cross-sectional diagram taken in the second direction, the third AF lens 137 may extend to have the same length as that of the other microlenses 131. However, the height of the third AF lens 137 may be greater than that of the other microlenses 131.

The region A3 may be disposed adjacent to the edge of the pixel array 100 in the second direction. Accordingly, the lens region 130 and the filter region 120 may be offset from each other in the second direction in consideration of an angle of incidence of light incident to the lens region 130. Also, the lens region 130 and the filter region 120 may be offset in the second direction with respect to the pixel regions PA of the substrate 101.

As illustrated in FIG. 11, by offsetting the filter region 120, the lens region 130, and the pixel regions PA of the substrate 101 in the second direction without aligning the elements with each other, a decrease in intensity of a pixel signal in each of the plurality of pixels may be further reduced toward the edge of the pixel array 100B. In an example embodiment according to FIG. 11, the filter region 120 may be offset from the pixel regions PA of the substrate 101, and accordingly, the fence pattern 121B may not be aligned with the pixel isolation layer 105. Referring to FIG. 11, the filter region 120 and the lens region 130 may be aligned with each other, or alternatively, the filter region 120 and the lens region 130 may also be offset from each other. In this case, the lens region 130 may be disposed more adjacent to the center of the pixel array 100B in the second direction than the filter region 120.

Figure 12:
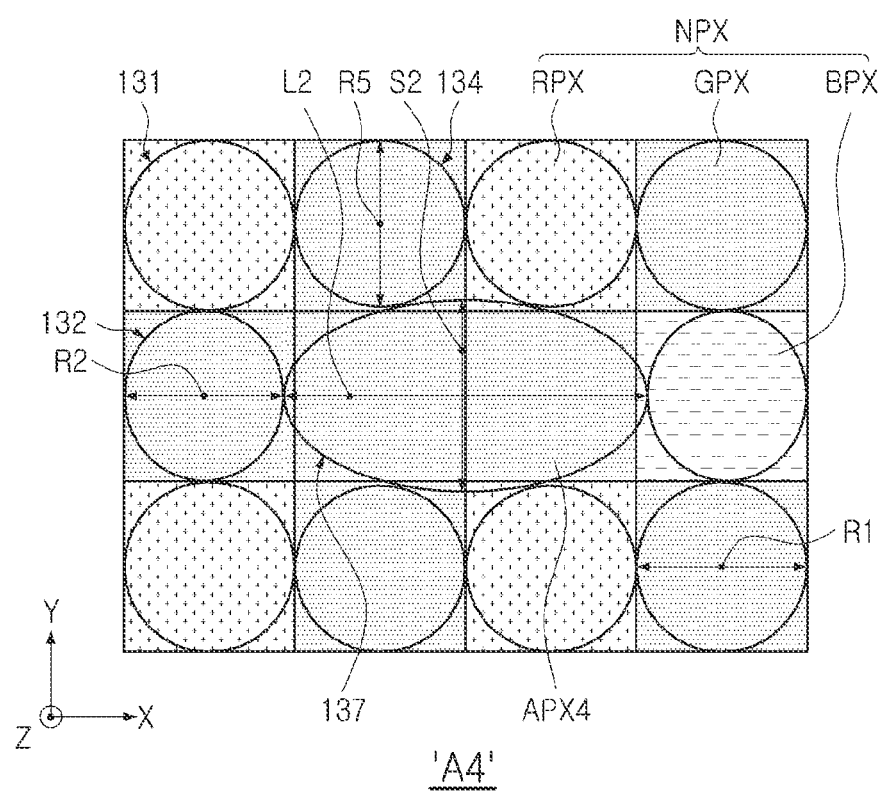
FIG. 12 is an enlarged diagram illustrating region A4 illustrated in FIG. 3 according to an example embodiment of the present disclosure.

FIG. 12 is an enlarged diagram illustrating region A4 illustrated in FIG. 3 according to an example embodiment of the present disclosure.

Referring to FIG. 12, similar to the regions A1 to A3, ten normal pixels NPX and a single fourth AF pixel APX4 may be disposed in region A4. The region A4 may be disposed more adjacent to the edge of the pixel array 100 than the region A1, and accordingly, an angle of incidence of light incident to the A4 region may be different from an angle of incidence of light incident to the region A1. Accordingly, the fourth AF lens 138 may be configured to have a relatively larger size than that of the first AF lens 135 in the region A1 such that the position in the fourth AF pixel APX4 in which light is focused may match the photodiodes.

As described above with reference to FIGS. 4A and 4B, the fourth AF lens 138 may have a second long axis L2 longer than the first long axis L1 of the first AF lens 135 in the first direction, which may be because the region A4 may be disposed in the same position as that of the region A2 in the first direction. Also, referring to FIG. 12, the fourth AF lens 138 may have a second short axis S2 longer than the first short axis S1 of the first AF lens 135 in the second direction. In other words, the fourth AF lens 138 may extend further than the first AF lens 135 in both the first direction and the second direction.

By increasing the length of the fourth AF lens 138 in the first direction and also in the second direction, sensitivity of the fourth AF pixel APX4 may increase. The fourth AF pixel APX4 may be spaced apart from the center of the pixel array 100 in the first direction and the second direction, and may be disposed adjacent to a corner of the pixel array 100 as illustrated in FIG. 3. Accordingly, intensity of light incident to the region A4 may be relatively weaker than intensity of light incident to the other regions A1 to A3. As illustrated in FIG. 12, by increasing the size of the fourth AF lens 138 in both the first direction and the second direction, a difference in intensity of the pixel signals due to the difference in intensity of light as described above may be reduced, and the effect of the autofocus function may improve.

Figure 13A:
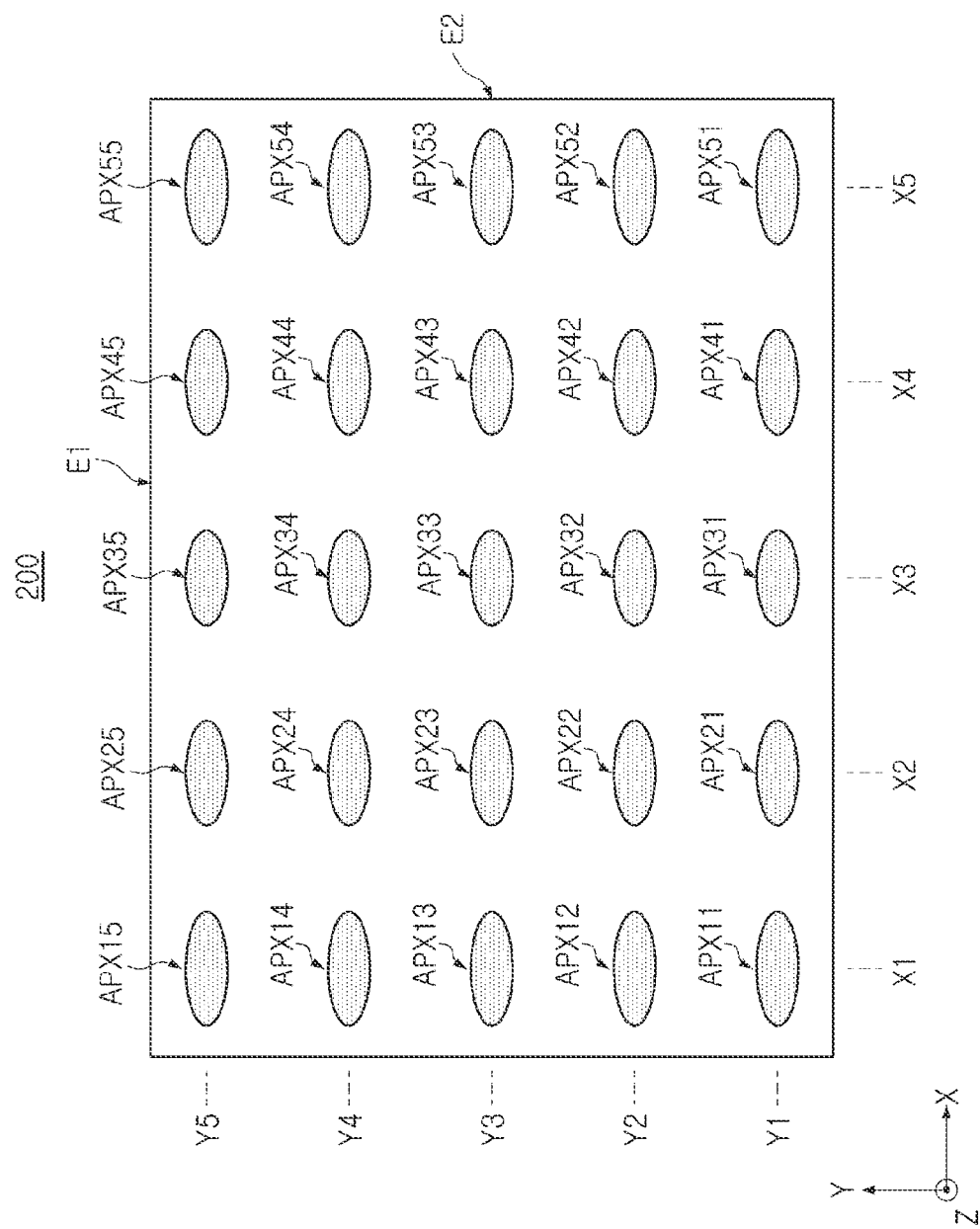
FIGS. 13A and 13B are diagrams illustrating AF pixels included in a pixel array according to an example embodiment of the present disclosure.
Figure 13B:
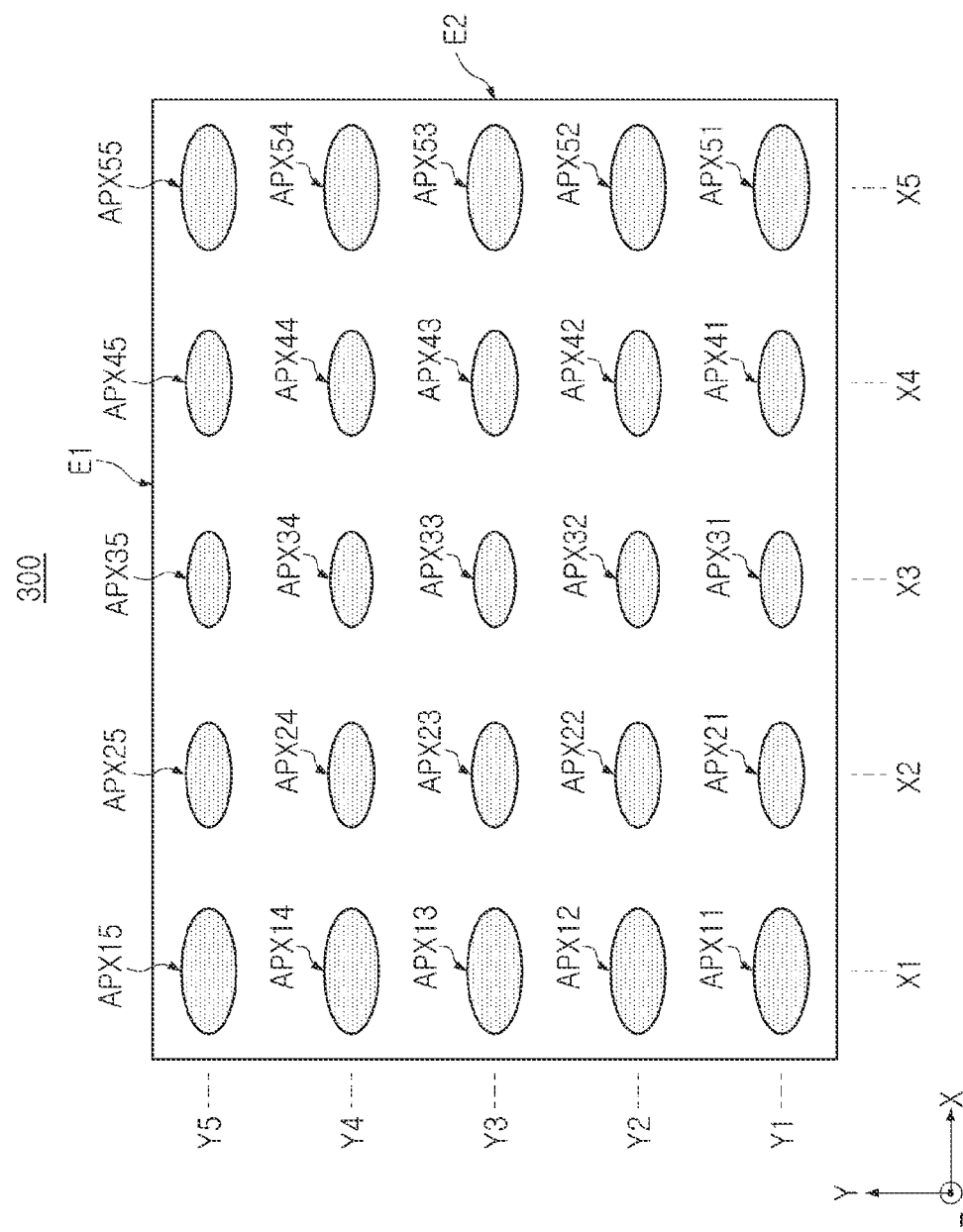

FIGS. 13A and 13B are diagrams illustrating AF pixels included in a pixel array according to an example embodiment.

Referring to FIG. 13A, the pixel array 200 in an example embodiment may include a plurality of AF pixels APX11-APX55 disposed in different positions. In an example embodiment according to FIG. 13A, the plurality of AF pixels APX11-APX55 may be disposed in predetermined positions X1-X5 and Y1-Y5 in a checkerboard shape in the first direction (X-axis direction) and the second direction (Y-axis direction). However, example embodiments of the present disclosure are not limited thereto.

In an example embodiment according to FIG. 13A, a size of the AF lens included in each of the plurality of AF pixels APX11-APX55 may increase toward edges E1 and E2 of the pixel array 200. Referring to FIG. 13A, the AF lenses included in the AF pixels APX11-APX55 disposed in the same position in the first direction may have the same size. For example, each of the five AF pixels APX31-APX35 disposed in the intermediate position X3 in the first direction may include AF lenses having the same size.

Differently from the above configuration, the AF lenses included in the AF pixels APX11-APX55 disposed in the same position in the second direction may have different sizes. For example, at least a portion of the five AF pixels APX13-APX53 disposed in the intermediate position Y3 in the second direction may include AF lenses having different sizes. Referring to FIG. 13A, among the five AF pixels APX13-APX53, the first AF pixel APX13 and the fifth AF pixel APX53 may include an AF lens having the largest size, and the third AF pixel APX33 may have an AF lens having a smallest size.

In other words, in the pixel array 200 according to an example embodiment illustrated in FIG. 13A, the size of the AF lens included in each of the plurality of AF pixels APX11-APX55 may increase in a direction of being further away from the center of the pixel array 200. In other words, the size of the AF lens may increase toward the second edge E2 extending in the second direction among the edges E1 and E2 of the pixel array 200.

Also, in an example embodiment illustrated in FIG. 13A, the size of the AF lens may increase only in the first direction in which a pair of photodiodes are adjacent to each other in each of the plurality of AF pixels APX11-APX55. Referring to FIG. 13A, the AF lens included in the AF pixel APX55 adjacent to an upper right corner of the pixel array 200 may have a greater length only in the first direction as compared to the AF lens included in the AF pixel APX33 most adjacent to the center of the pixel array 200. However, differently from such a configuration, the size of the AF lens may increase in the first direction and also in the second direction.

In an example embodiment, the size of the AF lens may increase linearly in a direction further away from the center of the pixel array 200 in the first direction. For example, assuming that the distances between the positions X1-X5 defined in the first direction are the same, the difference in sizes between the AF lens of the third AF pixel APX31 and the AF lens of the fourth AF pixel APX41 may be the same as the difference in sizes between the AF lens of the third AF pixel APX31 and the AF lens of the fourth AF pixel APX41. The size of the AF lens may increase linearly in a direction further away from the pixel array 200 in the first direction and toward the second edge E2 extending in the second direction.

In the pixel array 300 according to an example embodiment illustrated in FIG. 13B, the size of the AF lens included in each of the plurality of AF pixels APX11-APX55 may increase in both the first direction and the second direction. Referring to FIG. 13B, the length of the AF lens in the second direction may increase toward a first edge E1 and the length of the AF length in the first direction may increase toward the second edge E2 with respect to the AF pixel APX33 disposed most adjacent to the center of the pixel array 300, which may be obtained by adjusting the size of the AF lens in consideration of the angle of incidence of light incident to the plurality of AF pixels APX11-APX55 in both the first direction and the second direction.

Also as shown in FIG. 13B, the size of the AF lens may change linearly according to a distance from the center of the pixel array 300. However, example embodiments of the present disclosure are not limited thereto. For example, according to example embodiments, the size of the AF lens may change non-linearly depending on the position.

Figure 14:
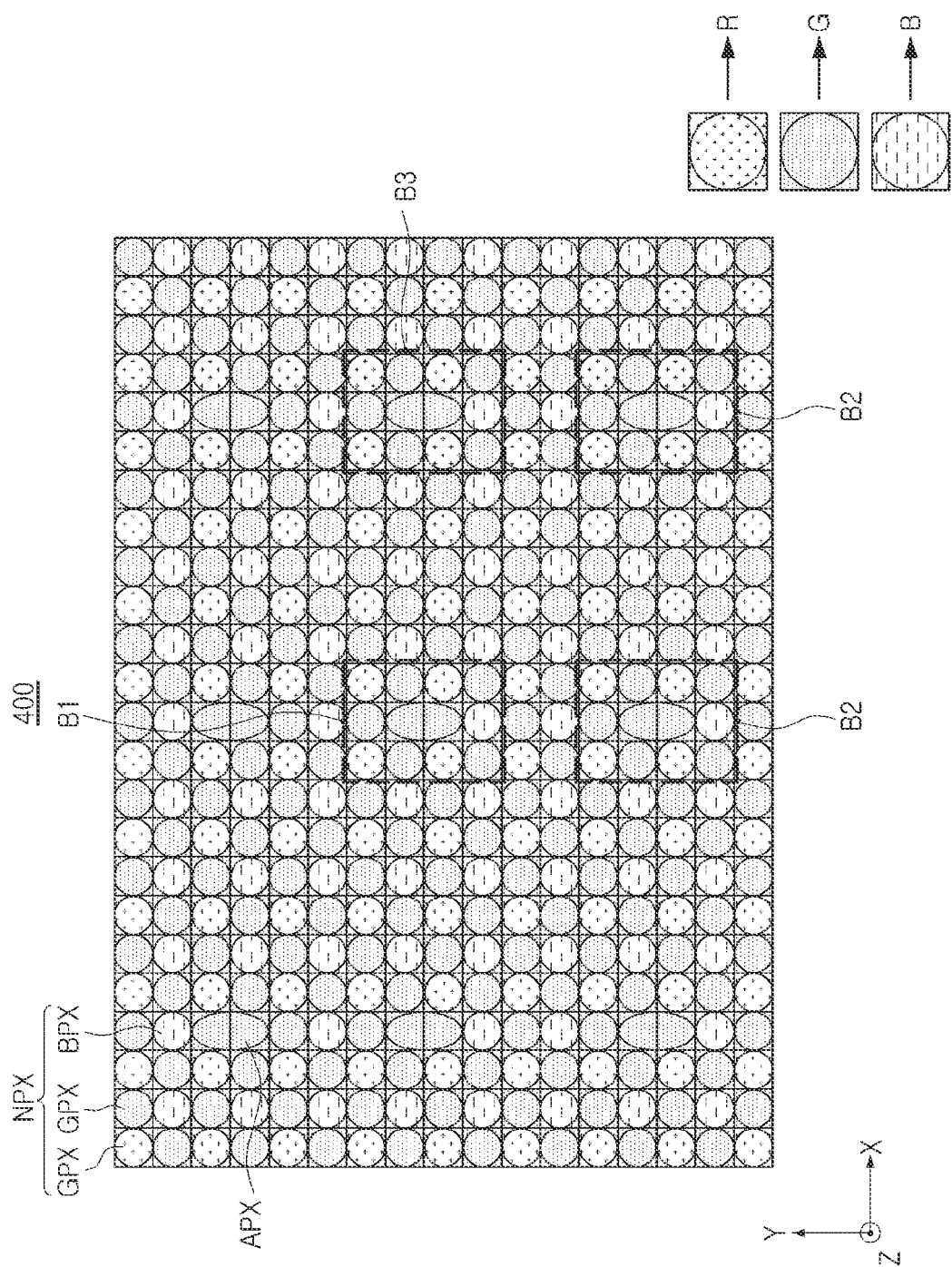
FIG. 14 is a diagram illustrating a pixel array according to an example embodiment of the present disclosure.

FIG. 14 is a diagram illustrating a pixel array according to an example embodiment.

Referring to FIG. 14, a pixel array 400 of an image sensor in an example embodiment may include a plurality of pixel regions arranged in a first direction (X-axis direction) and a second direction (Y-axis direction), and may further include a plurality of pixels NPX and APX disposed in the plurality of pixel regions. The plurality of normal pixels NPX may include red pixels RPX, green pixels GPX, and blue pixels BPX, and each of the plurality of AF pixels APX may include a pair of photodiodes adjacent to each other.

Referring to FIG. 14, a pair of photodiodes included in each of the plurality of AF pixels APX may be adjacent to each other in the second direction. Accordingly, in an example embodiment illustrated in FIG. 14, an autofocus function may be implemented using a phase difference between pixel signals obtained from a pair of photodiodes adjacent to each other in the second direction.

At least a portion of the AF pixels APX included in each of regions B1 to B4 disposed in different positions in the pixel array 400 may include AF lenses having different sizes, which may focus light refracted through the AF lens in each of the AF pixels APX on a pair of photodiodes included in each of the AF pixels APX, similar to example embodiments described above.

Figure 15A:
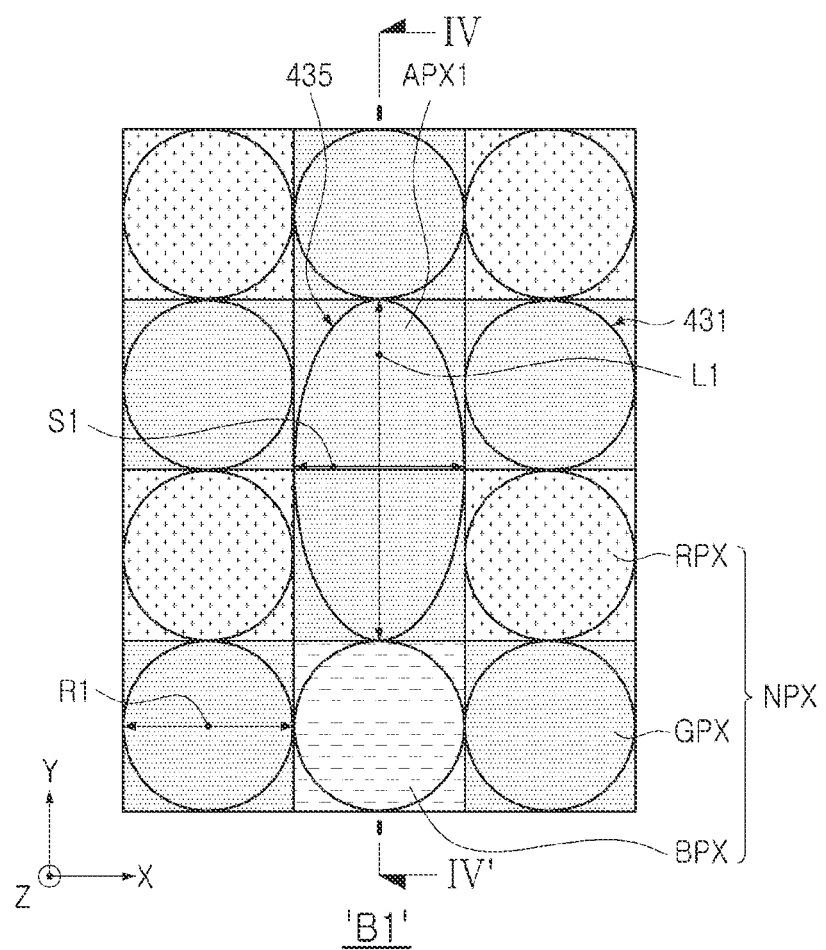
FIGS. 15A and 15B are enlarged diagrams illustrating region B1 and region B2, respectively, illustrated in FIG. 14 according to example embodiments of the present disclosure.
Figure 15B:
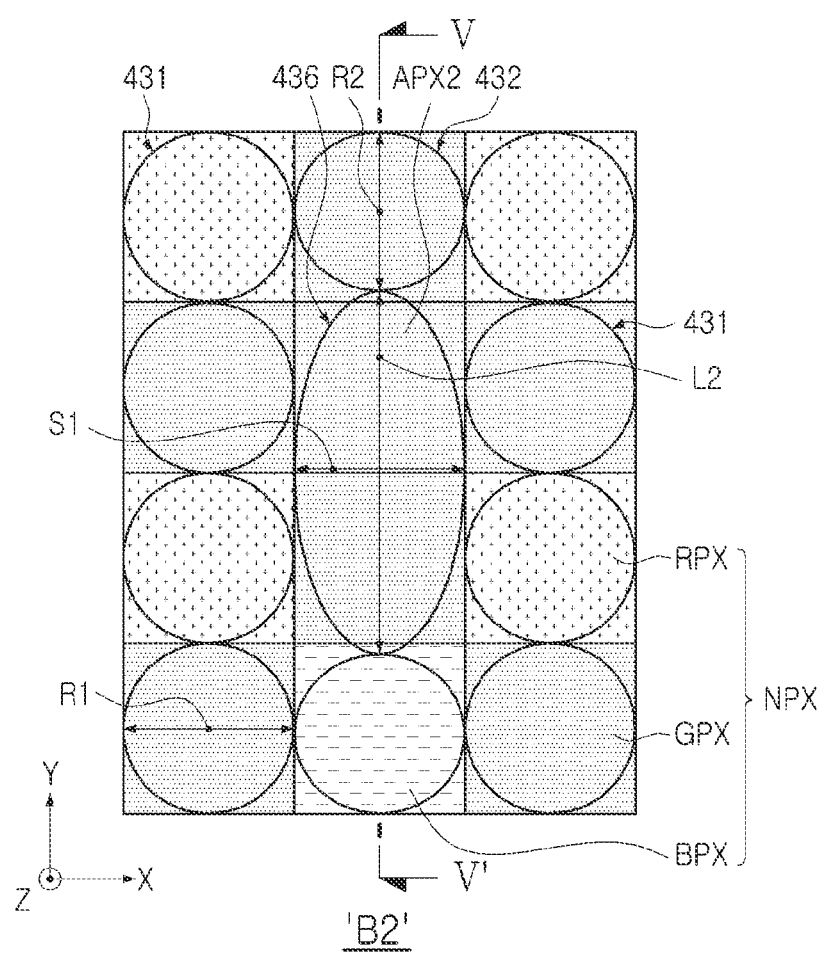

FIGS. 15A and 15B are enlarged diagrams illustrating region B1 and region B2, respectively, illustrated in FIG. 14 according to example embodiments of the present disclosure.

Referring to FIGS. 15A and 15B, ten normal pixels NPX and a single AF pixel APX1 and APX2 may be disposed in each of regions B1 and B2 of a pixel array 400. The first AF pixel APX1 included in region B1 may include a single first AF lens 435 disposed on a pair of photodiodes adjacent to each other in the second direction. The second AF pixel APX2 included in the region B2 may include a single second AF lens 436 disposed on a pair of photodiodes adjacent to each other in the second direction.

The first AF lens 435 may have a first short axis S1 in a first direction and a first long axis L1 in a second direction. The second AF lens 436 may have a first short axis S1 in the first direction and a second long axis L2 longer than the first long axis L1 in the second direction. As described above with reference to FIG. 14, the region B2 may be spaced apart from the center of the pixel array 400 than the region B1, and an angle of incidence of light incident to region B2 may be greater than an angle of incidence of light incident to the region B1.

Accordingly, the position in which light incident to the region B1 is focused may be different from the position in which light incident to the region B2 is focused in the third direction (Z-axis direction). For example, the position in which light incident to the region B1 is focused may be present within the photodiode, whereas the position in which light incident to the region B2 is focused may be present on the photodiode. Accordingly, the effect of the autofocus function in the region B2 may be lower than the effect of the autofocus function in the region B1.

To address the above issue, as illustrated in FIGS. 15A and 15B, in an example embodiment, sizes of the AF lenses 435 and 436 may be configured differently depending on the position of the pixel array 400. For example, the size of each of the AF lenses 435 and 436 may be varied in a direction in which a pair of photodiodes included in the AF pixels APX1 and APX2 are arranged.

Also, as the size of the second AF lens 436 adjacent to the edge of the pixel array 400 is increased, the size of the microlens 432 included in the neighboring pixels adjacent to the second AF lens 436 in the second direction may decrease as illustrated in FIG. 15B. For example, the microlens 432 included in each of the neighboring pixels may have a width R2 smaller than a diameter R1 of the other microlenses 431 in the second direction.

Figure 16:
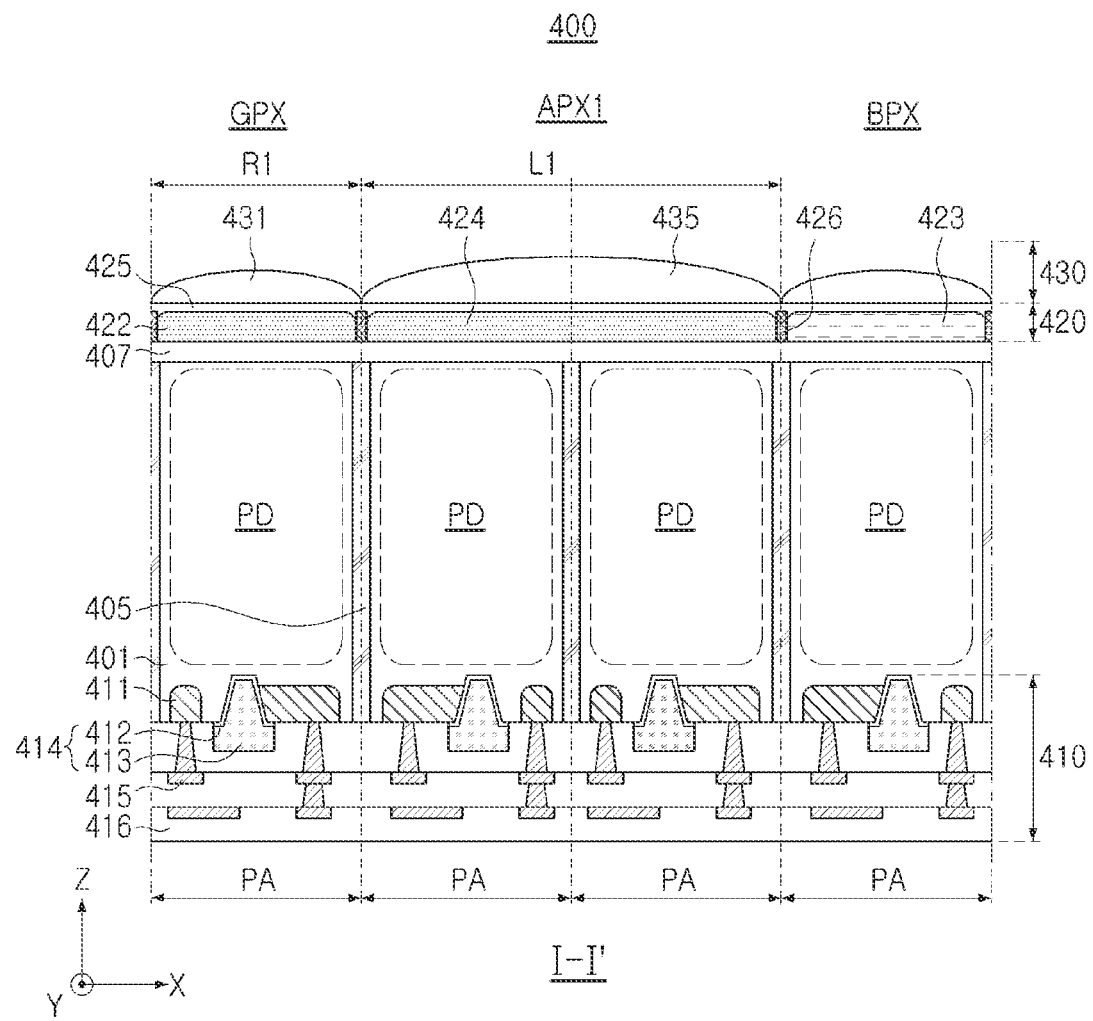
FIG. 16 is a cross-sectional diagram taken along line IV-IV' in FIG. 15A according to an example embodiment of the present disclosure.
Figure 17:
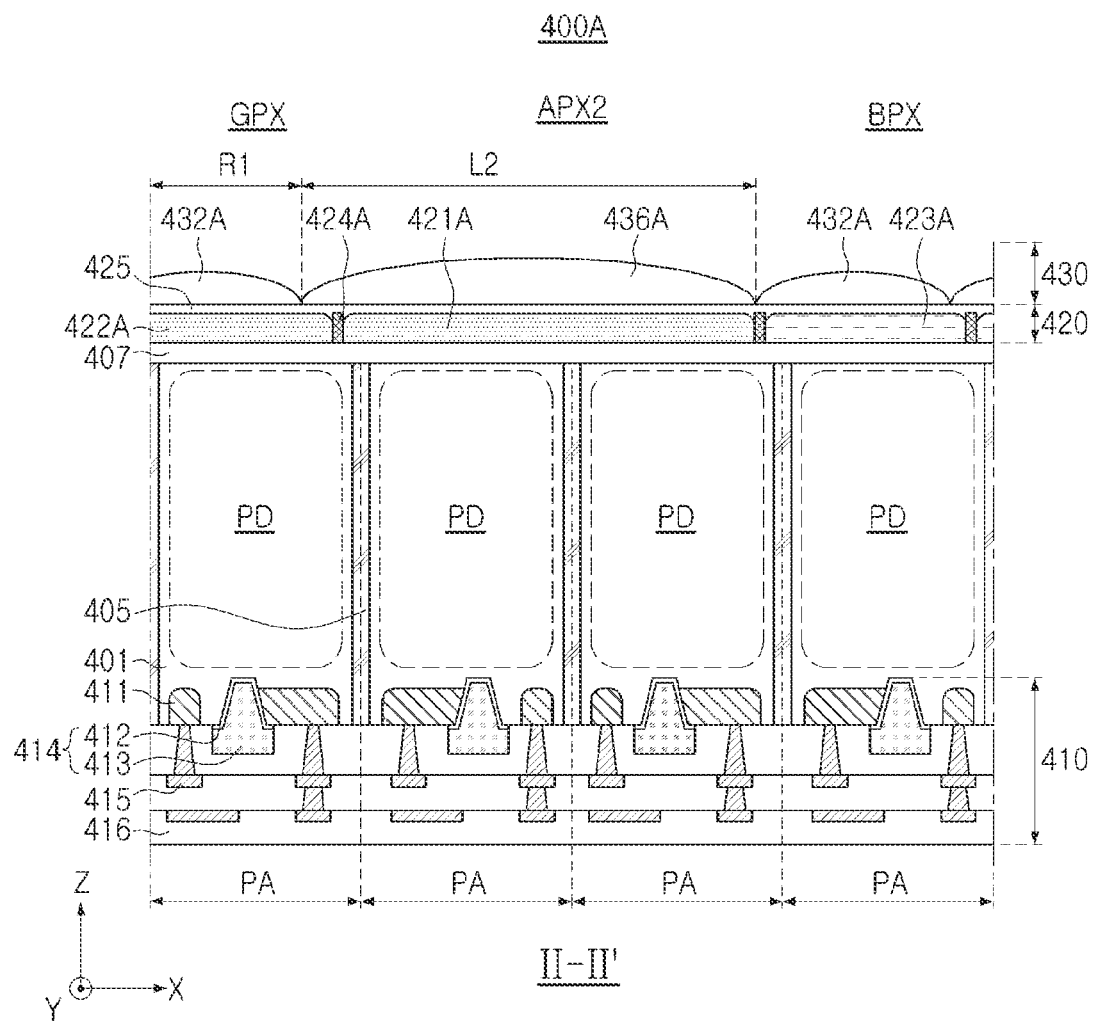
FIG. 17 is a cross-sectional diagram taken along line V-V' in FIG. 15A according to an example embodiment of the present disclosure.

FIG. 16 is a cross-sectional diagram taken along line IV-IV' in FIG. 15A according to an example embodiment of the present disclosure. FIG. 17 is a cross-sectional diagram taken along line V-V' in FIG. 15A according to an example embodiment of the present disclosure.

Referring to FIGS. 16 and 17, a plurality of pixel regions PA may be defined in a first direction (X-axis direction) and a second direction (Y-axis direction) parallel to an upper surface of the substrate 401, and at least one photodiode PD may be formed in each of the plurality of pixel regions PA. The plurality of pixel regions PA may be isolated from each other by a pixel isolation layer 105.

Each of the plurality of pixel regions PA may include a circuit region 410 disposed below the photodiode PD, a filter region 420 disposed above the photodiode PD, and a lens region 430. The configurations of the circuit region 410, the filter region 420, and the lens region 430 may be similar to the examples described above with reference to FIG. 5. For example, a horizontal insulating layer 407 may be disposed between the substrate 401 and the filter region 420. The horizontal insulating layer 407 may be formed of a high-k material.

In FIG. 16 illustrating a cross-sectional surface of region B1 adjacent to the center of the pixel array 400, a filter region 420, a lens region 430, and a plurality of pixel regions PA defined on the substrate 401 may be aligned with each other. Accordingly, a fence pattern 424 of the filter region 420 may be disposed on the pixel separator 405, and a boundary between the microlenses 431 and the first AF lens 435 may be aligned with the fence pattern 424.

Differently from the above example, in an example embodiment illustrated in FIG. 17, the filter region 420 and the lens region 430 in the pixel array 400A, and the plurality of pixel regions PA defined on the substrate 401, may be offset from each other. Referring to FIG. 17, in an example embodiment, the filter region 420 may be offset with respect to the plurality of pixel regions PA, and the pixel isolation layer 405 and the fence pattern 424A are not aligned. For example, the fence pattern 424A may be disposed more adjacent to the center of the pixel array 400A than the pixel isolation layer 405.

Also, the filter region 420 and the lens region 430 may be offset, such that in an example embodiment, the boundary between the microlens 432A and the second AF lens 436A is not aligned with the fence pattern 424A. In an example embodiment, the boundary between the microlens 432A and the second AF lens 436 may be disposed more adjacent to the center of the pixel array 400A than the fence pattern 424A.

Considering the configuration in which an angle of incidence of light incident to the region B2 may be greater than an angle of incidence of light incident to the region B1, the second AF lens 436A may be configured to be longer than the first AF lens 435 in the second direction. As the length of the second long axis L2 of the second AF lens 436A in the second direction increases, the microlens 432A included in each of the neighboring pixels adjacent to the second AF pixel APX in the second direction may have an area smaller than an area of the microlens 431 included in each of the neighboring pixels adjacent to the first AF pixel APX in the second direction.

Figure 18:
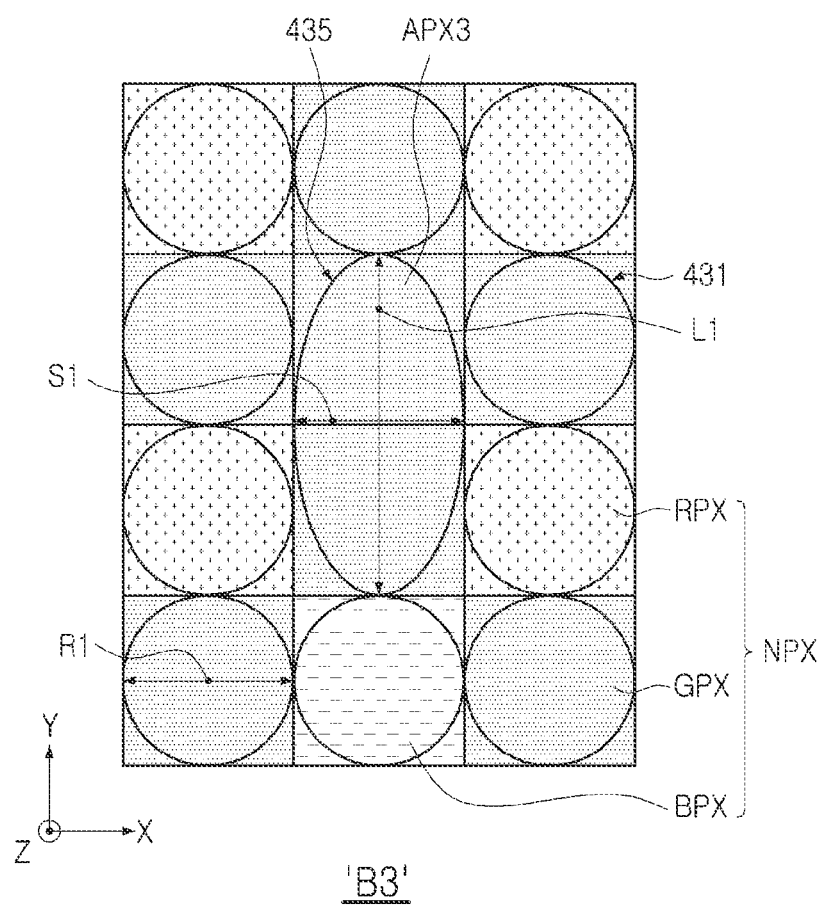
FIGS. 18 and 19 are enlarged diagrams illustrating region B3 and region B4, respectively, illustrated in FIG. 14 according to example embodiments of the present disclosure.
Figure 19:
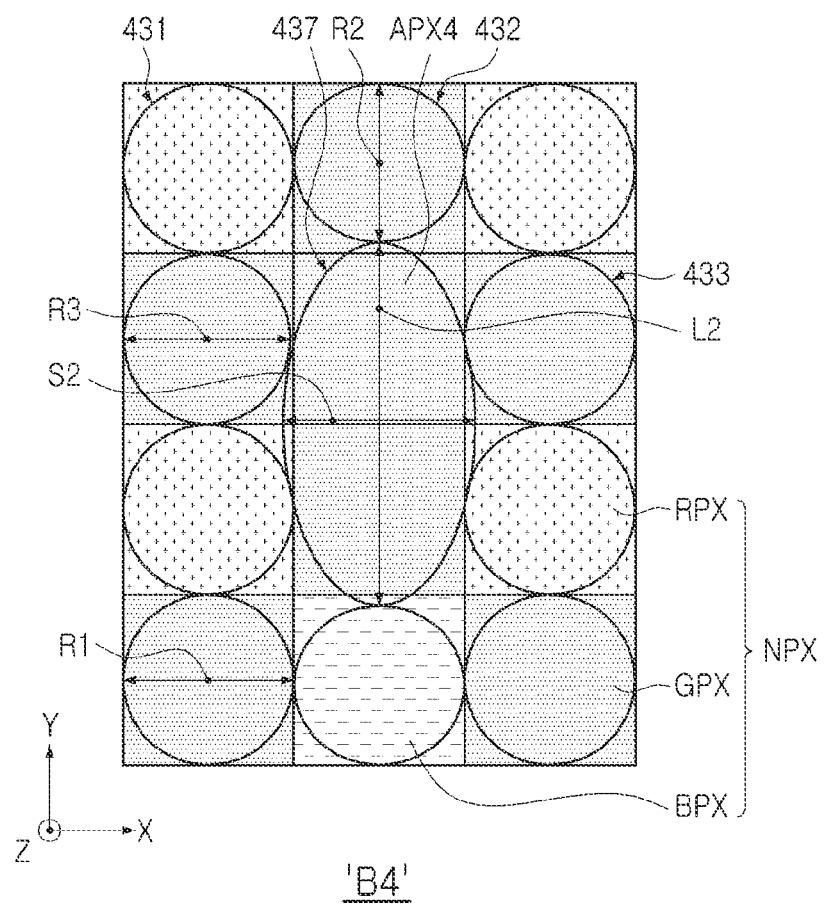

FIGS. 18 and 19 are enlarged diagrams illustrating region B3 and region B4 illustrated in FIG. 14.

Region B3 may be disposed more adjacent to the edge of the pixel array 400 than the region B1. As illustrated in FIG. 14, the region B3 may be further spaced apart from the center of the pixel array 400 than the region B1 in the first direction, and may be disposed in the same position as that of the region B1 in the second direction. Accordingly, as illustrated in FIG. 18, the third AF lens 437 of the third AF pixel APX3 included in the region B3 may have the same size as that of the first AF lens 435 of the first AF pixel APX1 included in the region B1. However, example embodiments of the present disclosure are not limited thereto. For example, according to example embodiments, the third AF lens 437 may be configured to have a size greater than that of the first AF lens 435 in the first direction.

Region B4 may be spaced apart from the center of the pixel array 400 in both the first direction and the second direction, as described above with reference to FIG. 14. Referring to FIG. 19, the fourth AF lens 438 of the fourth AF pixel APX4 disposed in the region B4 may have a size larger than that of the first AF lens 435 of the first AF pixel APX1 included in region B1.

For example, in an example embodiment illustrated in FIG. 19, the fourth AF lens 438 may have a second long axis L2 longer than a first long axis L1 of the first AF lens 435 in the second direction, and may have a second short axis S2 longer than the first short axis S1 of the first AF lens 435 in the first direction. Since the region B4 is disposed in the same position as that of the region B2 in the second direction, the fourth AF lens 438 and the second AF lens 436 may have the second long axis L2 having the same length in the second direction. Also, according to an example embodiment, the fourth AF lens 438 may be configured to have the same size as that of the second AF lens 436.

Figure 20:
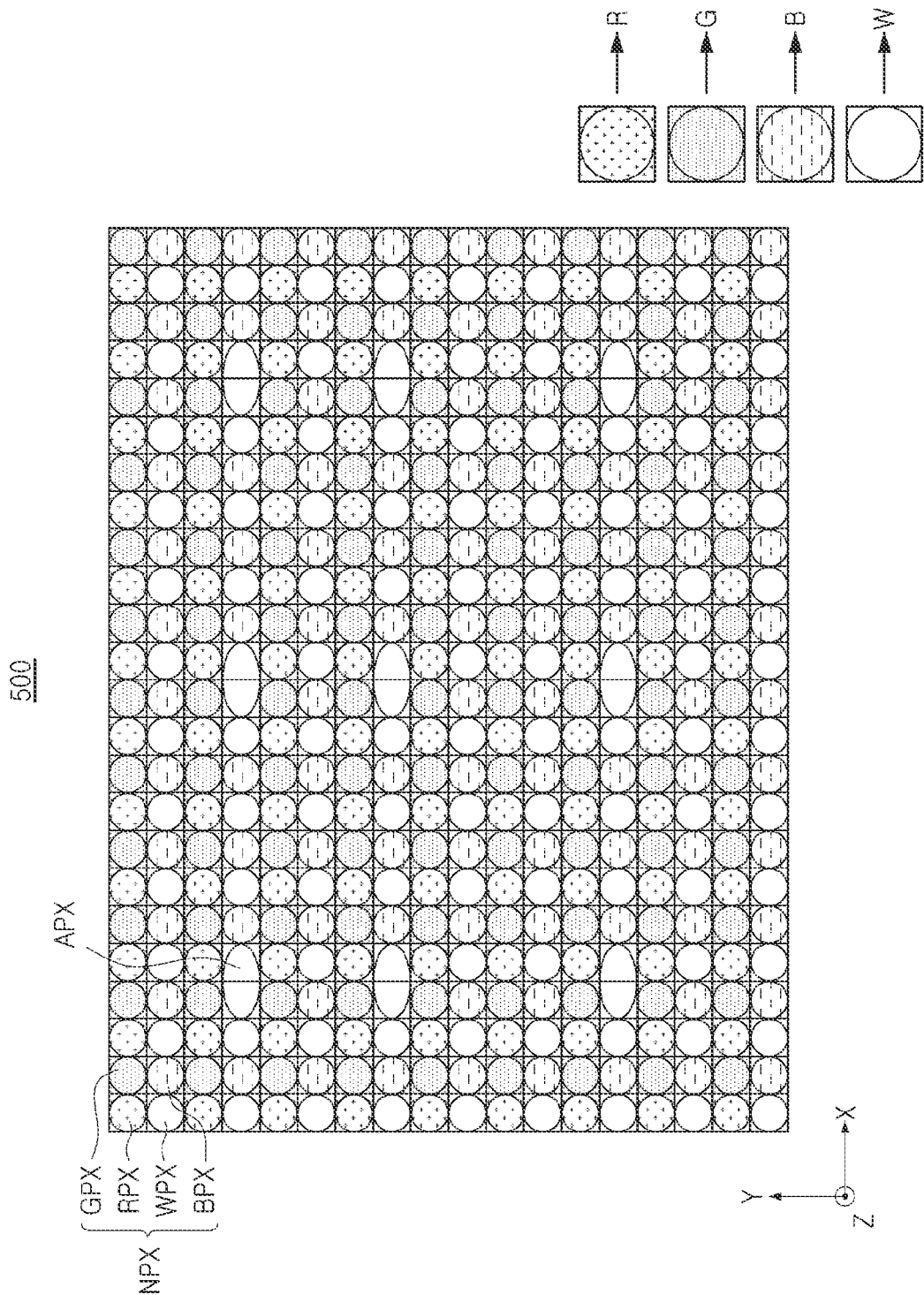
FIG. 20 is a diagram illustrating a pixel array according to an example embodiment of the present disclosure.

FIG. 20 is a diagram illustrating a pixel array according to an example embodiment.

Referring to FIG. 20, a pixel array 500 included in an image sensor in an example embodiment may include a plurality of pixels NPX and APX. The plurality of pixels NPX and APX may include a plurality of normal pixels NPX and a plurality of AF pixels APX for implementing an autofocus function.

In an example embodiment according to FIG. 20, the plurality of normal pixels NPX may include red pixels RPX, green pixels GPX, blue pixels BPX, and white pixels WPX. Each of the red pixels GPX may include a red color filter, each of the green pixels GPX may include a green color filter, and each of the blue pixels BPX may include a blue color filter. Each of the white pixels WPX may include a filter through which light of all wavelength bands may pass through.

Referring to FIG. 20, each of the plurality of AF pixels APX may have a light receiving region larger than that of each of the plurality of normal pixels NPX. For example, each of the plurality of normal pixels NPX may be disposed in a single pixel region and may include a single photodiode, and the plurality of AF pixels APX may be disposed in a pair of pixel regions adjacent to each other in the first direction and may include a pair of photodiodes. An AF lens disposed in each of the plurality of AF pixels APX may be disposed on a pair of pixel regions. Accordingly, a pair of photodiodes may share a single AF lens in each of the plurality of AF pixels APX.

In an example embodiment illustrated in FIG. 20, each of the plurality of AF pixels APX may include a filter through which light of all wavelength bands may pass, similar to the white pixels WPX. As light of all wavelength bands may be received for the autofocus function without filtering light of a specific wavelength band, sensitivity of the plurality of AF pixels APX may increase such that the autofocus function may improve.

Similar to example embodiments described above, AF lenses included in at least a portion of the plurality of AF pixels APX may have different sizes of areas. For example, the AF lens included in the AF pixel APX adjacent to the edge of the pixel array 500 may have a larger area as compared to the AF lens included in the AF pixel APX adjacent to the center of the pixel array 500. The AF lens adjacent to the edge of the pixel array 500 may extend further in the first direction as compared to the AF lens adjacent to the center of the pixel array 500.

Figure 21:
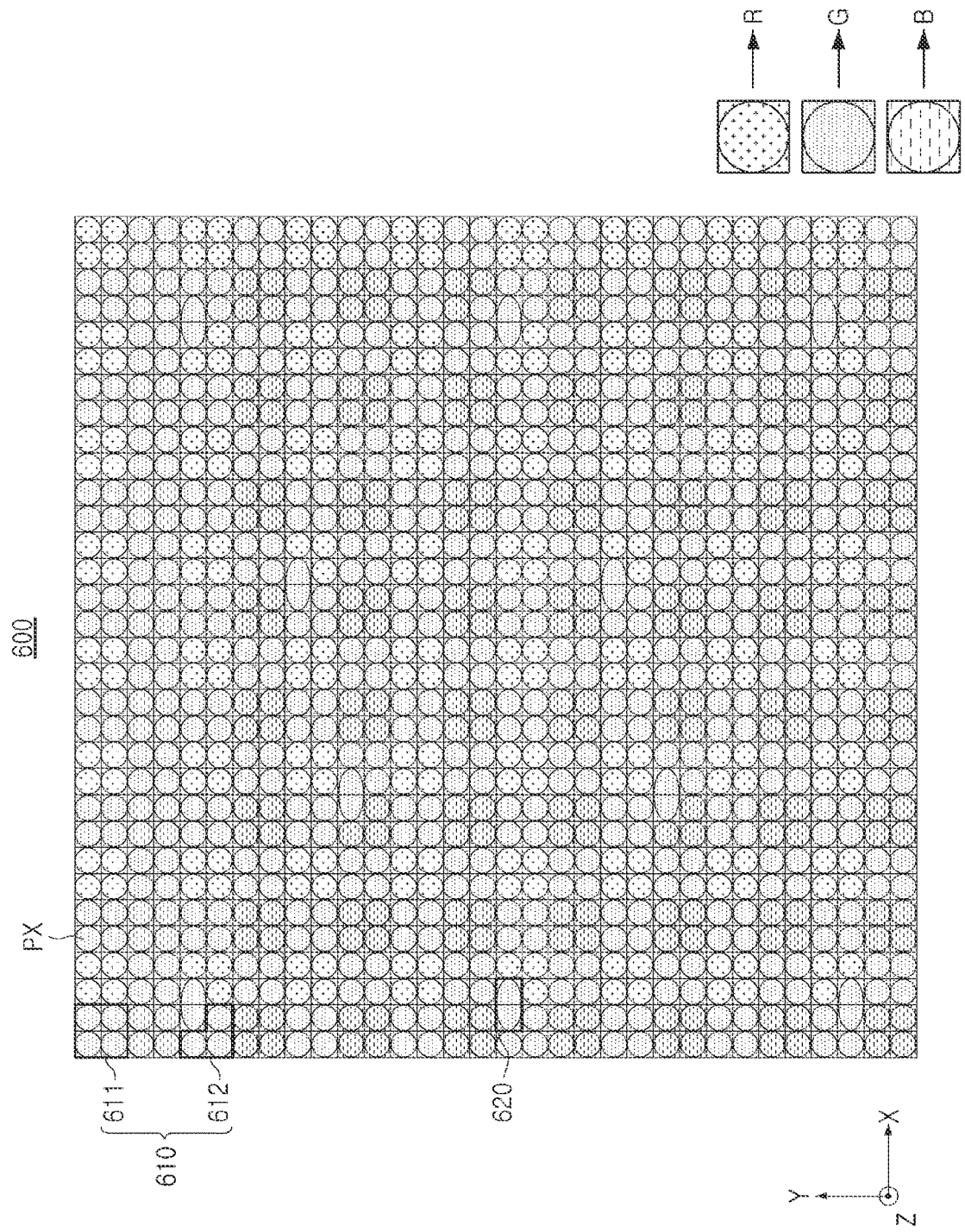
FIG. 21 is a diagram illustrating a pixel array according to an example embodiment of the present disclosure.

FIG. 21 is a diagram illustrating a pixel array according to an example embodiment.

Referring to FIG. 21, a pixel array 600 of an image sensor in an example embodiment may include a plurality of pixels PX arranged in a first direction (X-axis direction) and a second direction (Y-axis direction). In an example embodiment according to FIG. 21, two or more pixels PX adjacent to each other in at least one of the first direction and the second direction may provide pixel blocks 610 and 620.

The pixel blocks 610 and 620 may include a normal pixel block 610 and an AF pixel block 620. The normal pixel block 610 may include a first normal pixel block 611 and a second normal pixel block 612. Differently from the first normal pixel block 611, the second normal pixel block 612 may be adjacent to the AF pixel block 620 in the first direction. Referring to FIG. 21, the number of pixels PX included in the first normal pixel block 611 may be different from the number of pixels PX included in the second normal pixel block 612.

The AF pixel block 620 may include a pair of pixels PX adjacent to each other in the first direction. Differently from the configuration in which each of the pixels PX included in the normal pixel block 610 include a single microlens, a pair of pixels PX included in the AF pixel block 620 may share a single AF lens. Accordingly, as illustrated in FIG. 21, the AF lens included in the AF pixel block 620 may have an elliptical shape extending in the first direction.

In an example embodiment illustrated in FIG. 21, each of the AF pixel blocks 620 may include a green color filter. However, example embodiments of the present disclosure are not limited thereto and may be varied.

The size of the AF lens included in the AF pixel block 620 may be varied depending on the position of the AF pixel block 620. Hereinafter, the configuration will be described in greater detail with reference to FIGS. 22A to 22C.

Figure 22A:
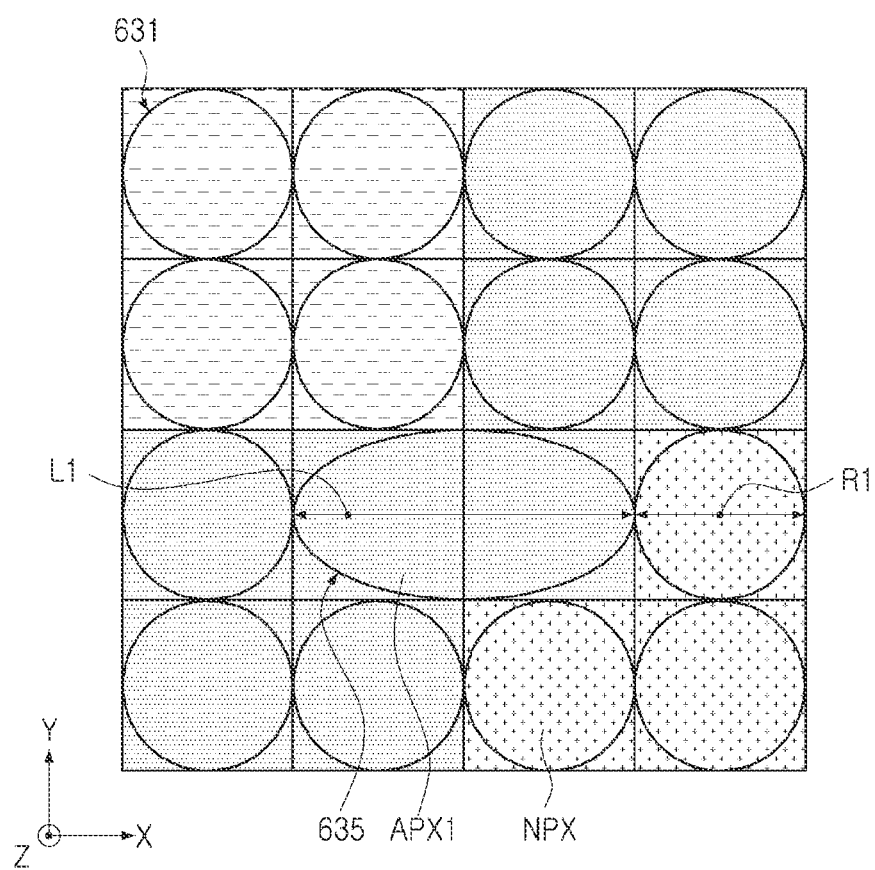
FIGS. 22A to 22C are diagrams illustrating a portion of regions illustrated in FIG. 21 according to example embodiments of the present disclosure.
Figure 22B:
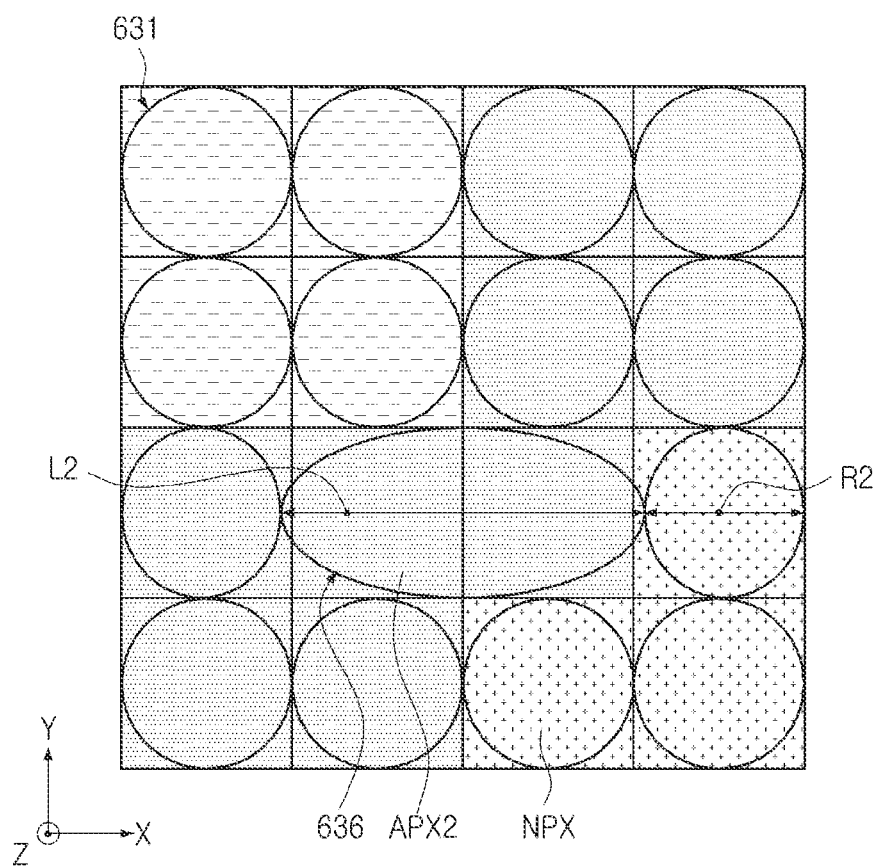
Figure 22C:
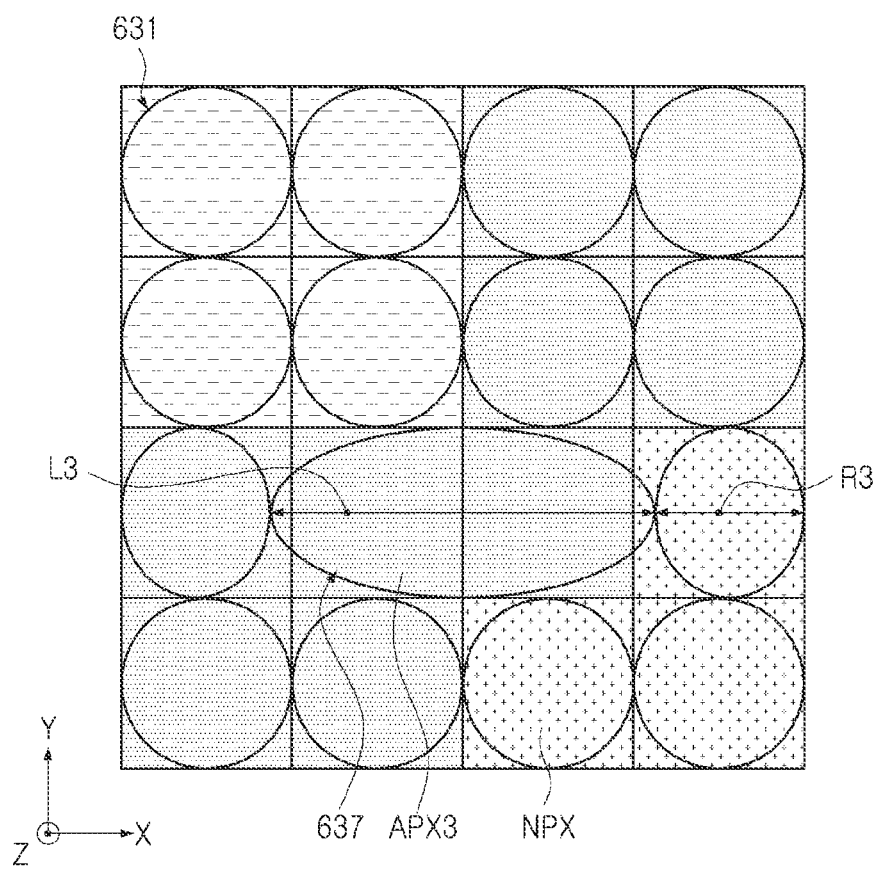

FIGS. 22A to 22C are diagrams illustrating a portion of regions illustrated in FIG. 21 according to example embodiments of the present disclosure.

FIGS. 22A to 22C are enlarged diagrams illustrating regions selected from different positions of the pixel array 600 illustrated in FIG. 21. The region illustrated in FIG. 22A may be a region disposed in a position adjacent to the center of the pixel array 600 and may include the first AF pixel block 620A. The first AF pixel block 620A may be disposed between a normal pixel NPX having a green color filter and a normal pixel NPX having a red color filter in a first direction (X-axis direction). However, alternatively, the first AF pixel block 620A may be disposed between the normal pixel NPX having a green color filter and the normal pixel NPX having a blue color filter.

Referring to FIG. 22A, in a region disposed adjacent to the center of the pixel array 600, the first AF lens 635 included in the first AF pixel block 620A may have a first long axis L1 in the first direction. The first long axis L1 may be about twice a diameter R1 of the microlens 631 of the normal pixel NPX.

Thereafter, the region illustrated in FIG. 22B may be a region isolated from the center of the pixel array 600 by a first distance. The second AF pixel block 620B disposed in the region illustrated in FIG. 22B may include a second AF lens 636 having a second long axis L2 longer than the first long axis L1 in the first direction. In other words, the length of the second AF lens 636 in the first direction may be greater than twice the diameter R1 of the microlens of the normal pixel NPX.

Accordingly, as illustrated in FIG. 22B, a size of the microlens may be reduced in each of the neighboring pixels adjacent to both sides of the second AF pixel block 620B so as to form the second AF lens 636 having the second long axis L2 in the first direction. Referring to FIG. 22B, the microlens 632 included in each of the neighboring pixels may have a width R2 smaller than the diameter R1 of the other microlenses 631 in the first direction. The position of the fence pattern isolating the color filters according to the boundary between the second AF lens 636 and the microlens 632 may not be changed regardless of the change in size of the microlens 632. However, in example embodiments, the position of the fence pattern may be changed according to the boundary of the microlens 632.

The region illustrated in FIG. 22C may be a region isolated from the center of the pixel array 600 by a second distance, and the second distance may be greater than the first distance described with reference to FIG. 22B. In other words, the region illustrated in FIG. 22C may be a region disposed adjacent to the edge of the pixel array 600 as compared to the region illustrated in FIGS. 22A and 22B.

The third AF pixel block 620C disposed in the region illustrated in FIG. 22C may include a third AF lens 637 having a third long axis L3 longer than the second long axis L2 in the first direction. Also, the microlens 633 of each of the neighboring pixels adjacent to the third AF pixel block 620C in the first direction may have a width R3 smaller than a diameter R1 of the other microlens 631 such that the third AF lens 637 may have the third long axis L3.

In an example embodiment, an angle of incidence of light incident to the first AF pixel block 620A may be smaller than an angle of incidence of light incident to the second AF pixel block 620B. Also, an angle of incidence of light incident to the third AF pixel block 620C may be greater than an angle of incidence of light incident to the second AF pixel block 620B. In an example embodiment, the size of the AF lenses 635-637 included in the AF pixel blocks 620A-620C may be configured differently in consideration of the angle of incidence of light which may be varied depending on the position in the pixel array 600, such that a difference in positions in which light is focused between the AF pixel blocks 620A to 620C may be reduced, and the autofocus function of the image sensor may improve.

Figure 23:
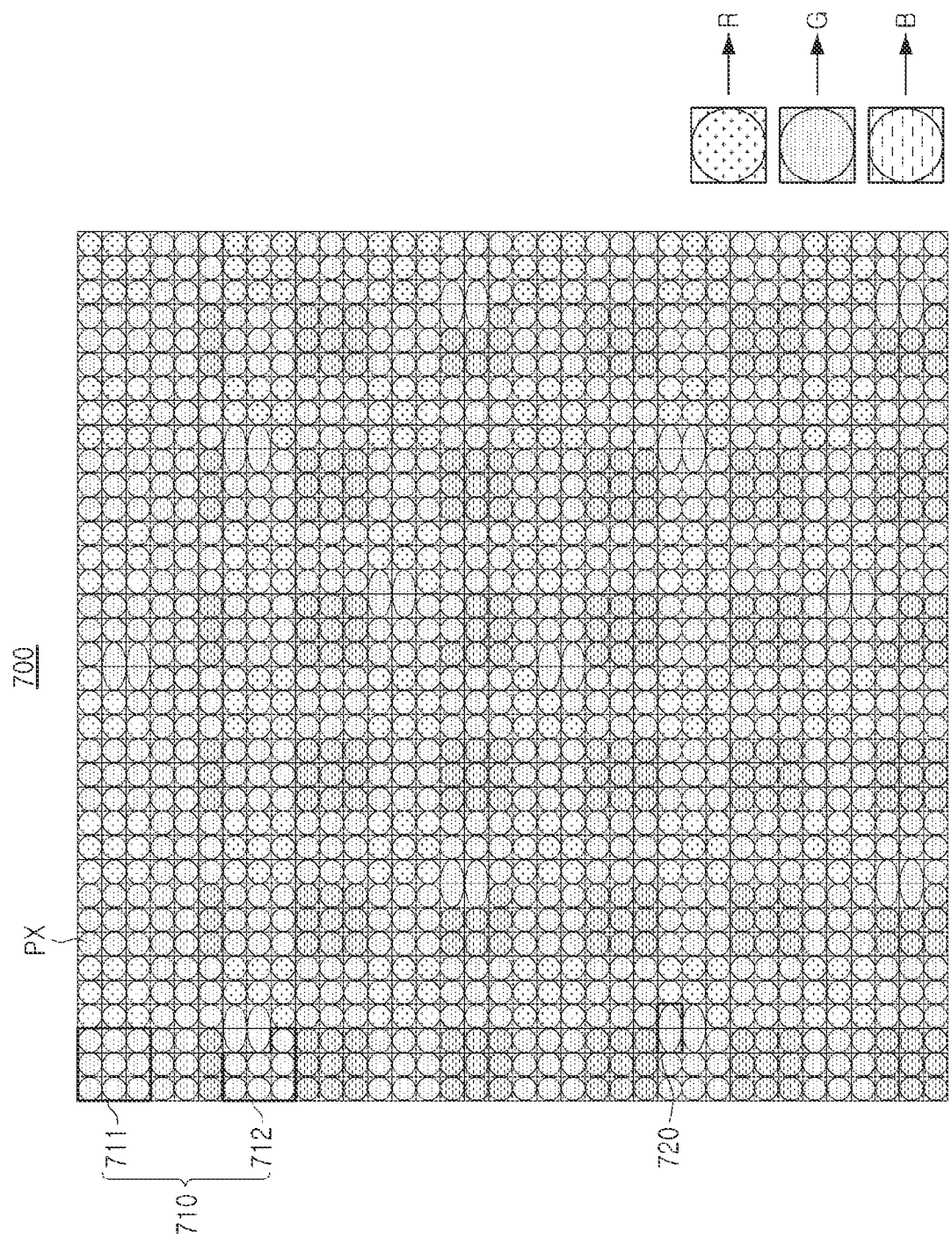
FIG. 23 is a diagram illustrating a pixel array according to an example embodiment of the present disclosure.

FIG. 23 is a diagram illustrating a pixel array according to an example embodiment.

A pixel array 700 of the image sensor in an example embodiment may include a plurality of pixels PX arranged in a first direction (X-axis direction) and a second direction (Y-axis direction) Referring to FIG. 23, two or more pixels PX adjacent to each other in at least one of the first direction and the second direction may provide pixel blocks 710 and 720.

The pixel blocks 710 and 720 may include a normal pixel block 710 and an AF pixel block 720. The normal pixel block 710 may include a first normal pixel block 711 and a second normal pixel block 712. The second normal pixel block 712 may be adjacent to the AF pixel block 720 in the first direction, whereas the first normal pixel block 711 may be adjacent to the other first normal pixel block 711 or the second normal pixel block 712 in the first direction. Referring to FIG. 23, the number of pixels PX included in the first normal pixel block 711 may be greater than the number of pixels PX included in the second normal pixel block 712.

The AF pixel block 720 may include a pair of pixels PX adjacent to each other in the first direction. Differently from the configuration in which each of the pixels PX in the normal pixel block 710 includes a single microlens, a pair of pixels PX may share a single AF lens in the AF pixel block 720. Accordingly, as illustrated in FIG. 21, the AF lens included in the AF pixel block 720 may have an elliptical shape extending in the first direction.

In an example embodiment illustrated in FIG. 23, the first normal pixel block 711 may include nine pixels PX arranged in a 3×3 shape. Also, two AF pixel blocks 720 may be disposed between a pair of second normal pixel blocks 712 adjacent to each other in the first direction. The two AF pixel blocks 720 may be arranged side by side in the second direction, or alternatively, other pixels PX may be arranged between the two AF pixel blocks 720. Also, in an example embodiment, only one AF pixel block 720 may be disposed or three AF pixel blocks 720 may be disposed between a pair of second normal pixel blocks 712 adjacent to each other in the first direction.

In an example embodiment illustrated in FIG. 23, the AF pixel blocks 720 may include a green color filter. However, example embodiments of the present disclosure are not limited thereto. The size of the AF lens included in the AF pixel block 720 may be varied depending on the position of the AF pixel block 720. Hereinafter, the configuration will be described in greater detail with reference to FIGS. 24A to 24C.

Figure 24A:
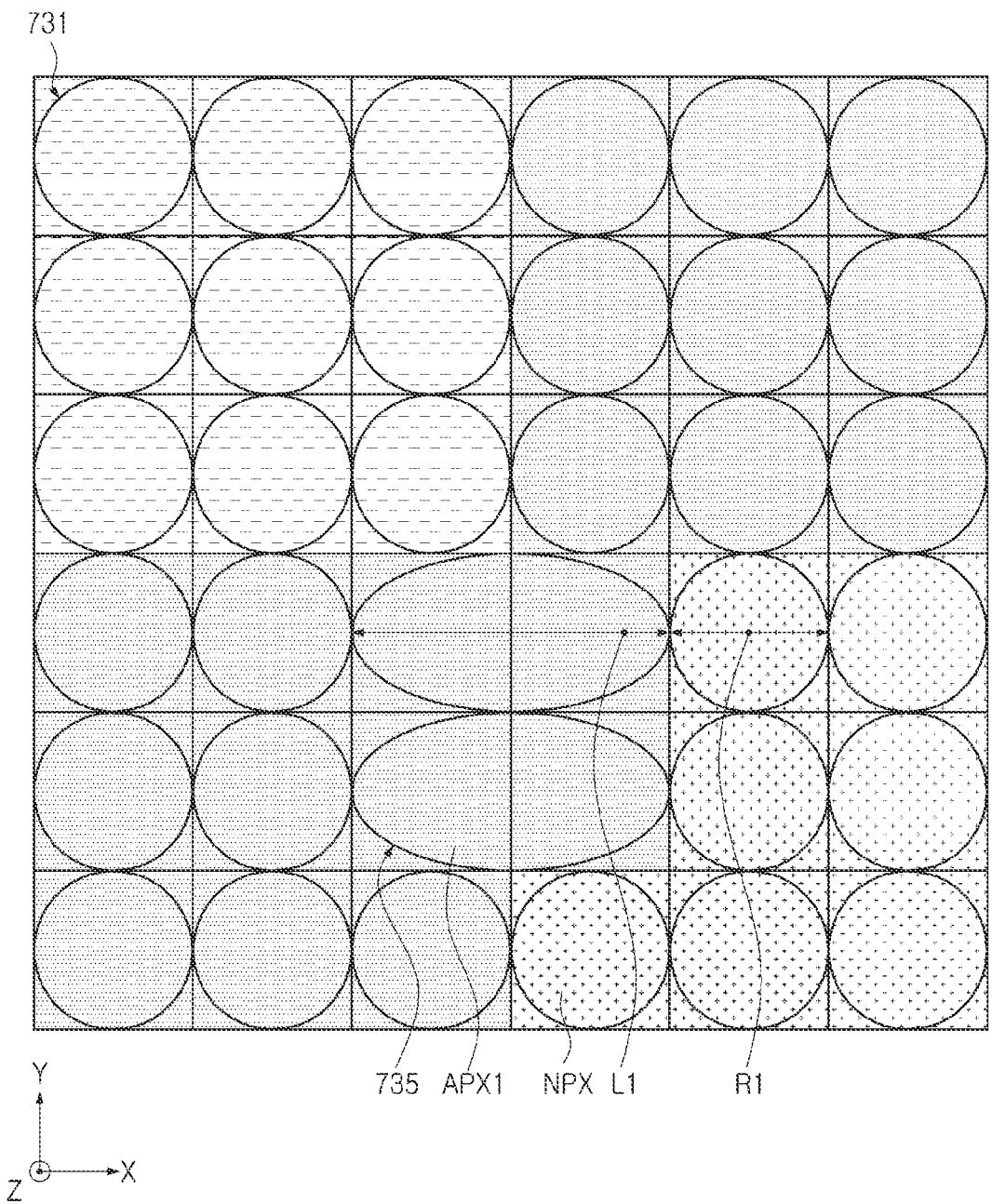
FIGS. 24A to 24C are enlarged diagrams illustrating a portion of regions illustrated in FIG. 23 according to example embodiments of the present disclosure.
Figure 24B:
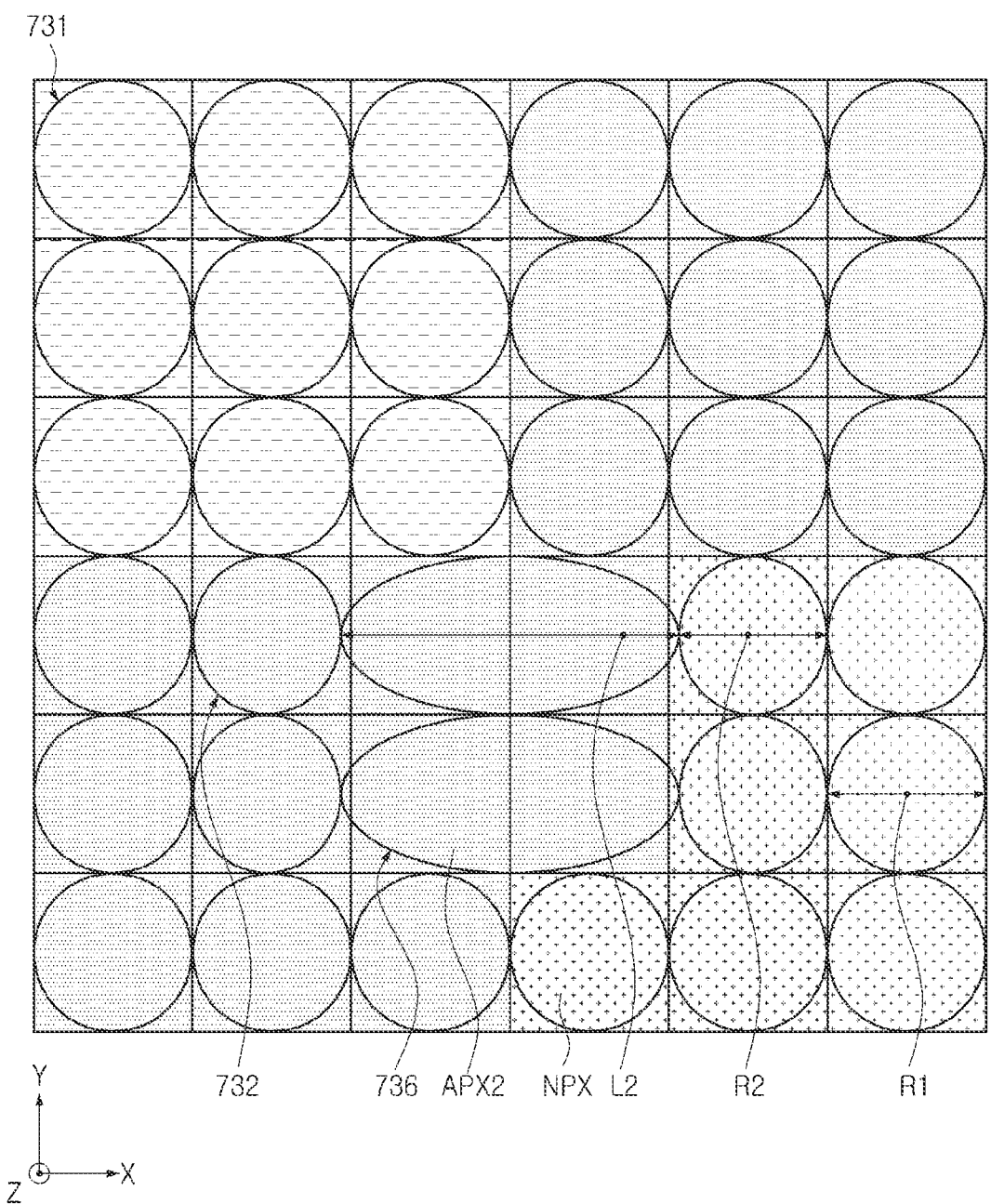
Figure 24C:
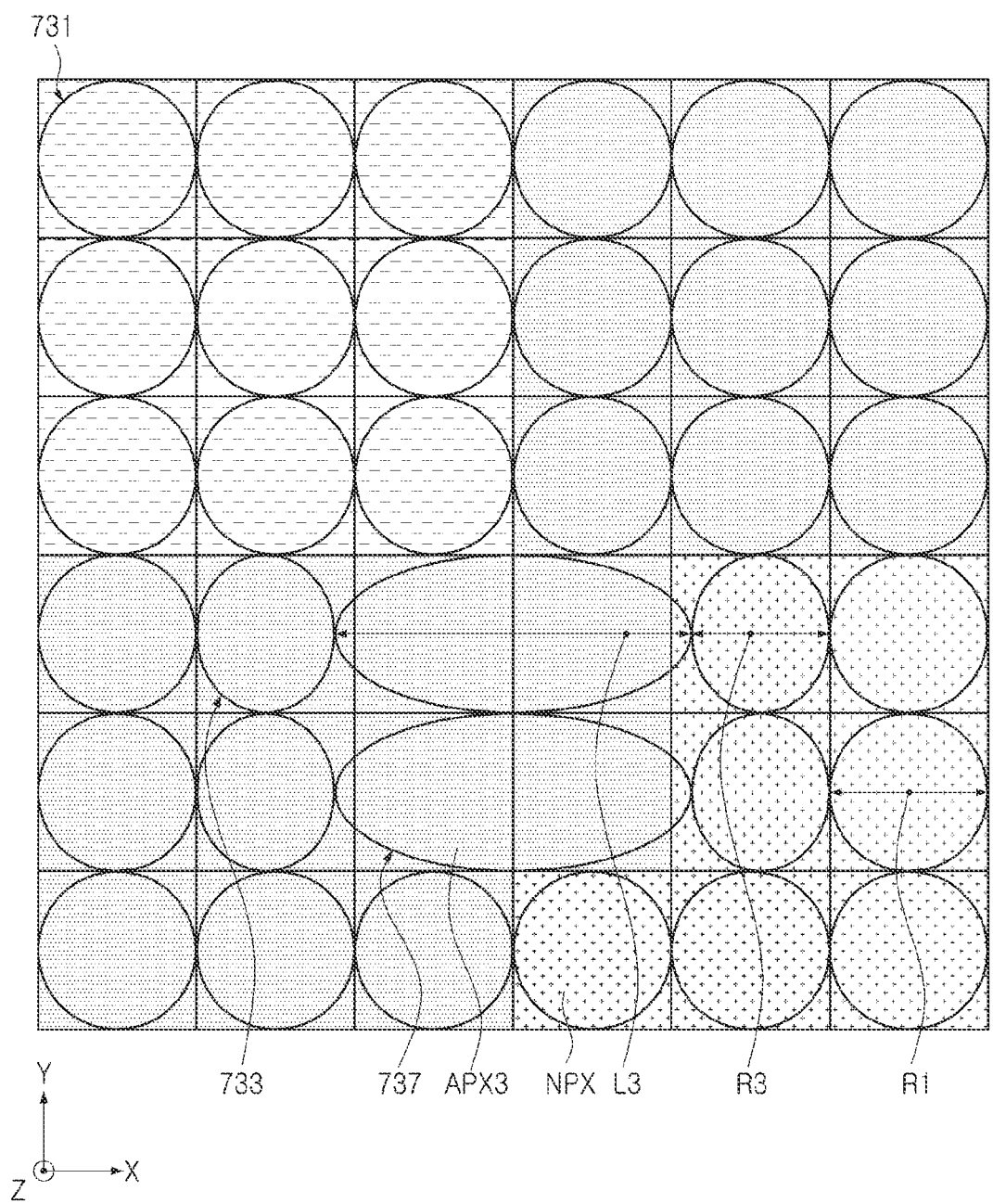

FIGS. 24A to 24C are enlarged diagrams illustrating a portion of regions illustrated in FIG. 23 according to example embodiments of the present disclosure.

FIGS. 24A to 24C are enlarged diagrams illustrating regions disposed in different positions in the pixel array 700 illustrated in FIG. 23. For example, the region illustrated in FIG. 24A may be a region disposed most adjacent to the center of the pixel array 700, and the region illustrated in FIG. 24C may be a region disposed furthest away from the center of the pixel array 700. The region illustrated in FIG. 24B may be disposed between the region illustrated in FIG. 24A and the region illustrated in FIG. 24C in the first direction (X-axis direction).

Referring to FIG. 24A, in a region disposed adjacent to the center of the pixel array 700, the first AF lens 735 included in the first AF pixel block 720A may have a first long axis L1 in the first direction. The first long axis L1 may be about twice the diameter R1 of the microlens 731 of the normal pixel NPX.

Thereafter, referring to FIG. 22B, the second AF lens 736 included in the second AF pixel block 720B may have a second long axis L2 in a first direction, and the second long axis L2 may be longer than the first long axis L1. Accordingly, the microlens 732 included in each of the neighboring pixels adjacent to the second AF pixel block 720B in the first direction may have a width R2 smaller than a diameter R1 of the microlens 731 of the other normal pixel NPX. In an example embodiment, the position of the fence pattern isolating the color filters may not be changed regardless of the boundary between the second AF lens 736 and the microlens 732.

Referring to FIG. 22C, the third AF lens 737 included in the third AF pixel block 720C may have a third long axis L3 in a first direction, and the third long axis L3 may be longer than the long axis L2. Accordingly, the microlens 733 included in each of the neighboring pixels adjacent to the third AF pixel block 720C in the first direction may have a width R3 smaller than the diameter R1 of the microlens 731 of the other normal pixels NPX. In FIG. 22C, only the microlens 733 of each of the neighboring pixels may have the relatively small width R3. However, differently from the example, each of the normal pixels NPX adjacent to the third AF pixel block 720C in the first direction may have a microlens having a reduced width in the second normal pixel block.

According to example embodiments described above, the second AF lens included in the second AF pixel adjacent to the edge of the pixel array may have a long axis longer than that of the first AF lens included in the first AF pixel adjacent to the center of the pixel array. Accordingly, even when light is incident to each of the first AF lens and the second AF lens at different angle of incidences, a difference in positions in which a focus is disposed in each of the first AF pixel and the second AF pixel may be reduced, and autofocus performance of the image sensor may improve.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to example embodiments thereof, it will be understood by those of ordinary skill in the art that various changes in form and detail may be made therein without departing from the spirit and scope of the present disclosure as defined by the following claims.

What is claimed is:

1. An image sensor, comprising:
a pixel array including a plurality of pixel regions arranged in a first direction and a second direction intersecting the first direction, wherein each of the plurality of pixel regions includes at least one photodiode, a circuit region disposed below the photodiode, a filter region disposed above the photodiode, and a lens region disposed above the filter region; and
a logic circuit configured to obtain a pixel signal from the circuit region,
wherein the pixel array includes a plurality of normal pixels and a plurality of autofocus (AF) pixels,
wherein each of the plurality of AF pixels is disposed in a pair of pixel regions adjacent to each other in the first direction, and includes an AF lens disposed in the lens region above the pair of pixel regions and having a long axis extending in the first direction,
wherein a long axis of a first AF lens disposed in a first position of the pixel array is shorter than a long axis of a second AF lens disposed in a second position of the pixel array, and the first position is more adjacent to a center of the pixel array than the second position,
wherein each of the plurality of normal pixels includes a microlens disposed in the lens region, and
wherein a first width of a first microlens adjacent to the first AF lens in the first direction is greater than a second width of a second microlens adjacent to the second AF lens in the first direction.

2. The image sensor of claim 1,
wherein the plurality of normal pixels include a plurality of neighboring pixels adjacent to at least one of the plurality of AF pixels in the first direction, and
wherein a length of the microlens included in at least one of the plurality of neighboring pixels is shorter than a length of the microlens included in normal pixels not adjacent to the at least one of the plurality of AF pixels among the plurality of normal pixels, in the first direction.

3. The image sensor of claim 2, wherein the microlens included in a normal pixel among the plurality of normal pixels that is adjacent to at least one of the neighboring pixels in the second direction has a length shorter than a length of the microlens included in other normal pixels among the plurality of normal pixels in the second direction.

4. The image sensor of claim 1,
wherein the plurality of AF pixels include a first AF pixel disposed in the first position and a second AF pixel disposed in the second position, and
wherein the second AF pixel is disposed more adjacent to an edge of the pixel array than the first AF pixel, and the edge extends along the second direction.

5. The image sensor of claim 4, wherein a difference in positions between a first AF color filter disposed in the filter region in the first AF pixel and the first AF lens is less than a difference in positions between a second AF color filter disposed in the filter region in the second AF pixel and the second AF lens.

6. The image sensor of claim 5, wherein the second AF lens is disposed more adjacent to a center of the pixel array than the second AF color filter in the second AF pixel.

7. The image sensor of claim 1, wherein a color filter disposed in the filter region is a green color filter in each of the plurality of AF pixels.

8. The image sensor of claim 7, wherein a length of the color filter disposed in the filter region in each of the plurality of AF pixels is longer than a length of a color filter disposed in the filter region in each of the plurality of normal pixels, in the first direction.

9. The image sensor of claim 1, wherein a length of a short axis of the first AF lens is the same as a length of a short axis of the second AF lens.

10. The image sensor of claim 9, wherein the length of the short axis of each of the first AF lens and the second AF lens is the same as a diameter of a microlens disposed in the lens region of each of the plurality of normal pixels.

11. The image sensor of claim 1, wherein a number of the plurality of normal pixels is greater than a number of the plurality of AF pixels.

12. The image sensor of claim 1, wherein a thickness of the AF lens is greater than a thickness of a microlens disposed in the lens region of each of the plurality of normal pixels.

13. An image sensor, comprising:
- a pixel array including a plurality of normal pixels arranged in a first direction and a second direction parallel to an upper surface of a substrate, and a plurality of autofocus (AF) pixels disposed between at least a portion of the plurality of normal pixels; and
- a logic circuit configured to provide an autofocus function using a phase difference between pixel signals obtained from each of the plurality of AF pixels,
- wherein a light receiving region of each of the plurality of AF pixels is larger than a light receiving region of each of the plurality of normal pixels, each of the plurality of AF pixels includes a pair of photodiodes and an AF lens disposed above the pair of photodiodes, and each of the plurality of normal pixels includes a microlens disposed above the normal pixels and having an axis extending in the first direction,
- wherein a length of a long axis extending in the first direction in the AF lens included in each of the plurality of AF pixels increases linearly toward a second edge extending in the second direction among a plurality of edges of the pixel array, and a length of the axis extending in the first direction in the microlens included in at least some of the normal pixels does not increase linearly toward the second edge,
- wherein the length of the axis extending in the first direction of a first microlens included in a first normal pixel adjacent to a first AF lens included in a first AF pixel in the first direction is greater than the length of the axis extending in the first direction of a second microlens included in a second normal pixel adjacent to a second AF lens included in a second AF pixel in the first direction, and
- wherein the first AF pixel is disposed more adjacent to a center of the pixel array than the second AF pixel.

14. The image sensor of claim 13, wherein the pair of photodiodes are arranged in the first direction in each of the plurality of AF pixels.

15. The image sensor of claim 13, wherein a light receiving region of each of the pair of photodiodes is the same as a light receiving region of a photodiode included in each of the plurality of normal pixels.

16. The image sensor of claim 13,
- wherein the length of the long axis of the first AF lens included in the first AF pixel is shorter than the length of the long axis of the second AF lens included in the second AF pixel.

17. The image sensor of claim 16,
- wherein the second AF pixel is disposed closer to a first edge extending in the first direction among the plurality of edges of the pixel array than the first AF pixel, and
- wherein a length of a short axis of the first AF lens is shorter than a length of a short axis of the second AF lens.

18. The image sensor of claim 16, wherein a thickness of the first AF lens is the same as a thickness of the second AF lens.

* * * * *